United States Patent
Koshihara et al.

(10) Patent No.: US 11,895,871 B2
(45) Date of Patent: Feb. 6, 2024

(54) LIGHT EMITTING DEVICE AND ELECTRONIC EQUIPMENT INCLUDING A LIGHT REFLECTION LAYER, AN INSULATION LAYER, AND A PLURALITY OF PIXEL ELECTRODES

(71) Applicant: SEIKO EPSON CORPORATION, Tokyo (JP)

(72) Inventors: Takeshi Koshihara, Matsumoto (JP); Ryoichi Nozawa, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/749,757

(22) Filed: May 20, 2022

(65) Prior Publication Data
US 2022/0278184 A1    Sep. 1, 2022

Related U.S. Application Data

(60) Continuation of application No. 16/891,482, filed on Jun. 3, 2020, now Pat. No. 11,374,077, which is a (Continued)

(30) Foreign Application Priority Data

Aug. 27, 2013 (JP) .................................. 2013-175339

(51) Int. Cl.
*H10K 59/121*    (2023.01)
*H10K 50/852*    (2023.01)
(Continued)

(52) U.S. Cl.
CPC ....... *H10K 59/1213* (2023.02); *H10K 50/852* (2023.02); *H10K 50/856* (2023.02); (Continued)

(58) Field of Classification Search
CPC .. H10K 59/1213; H10K 59/35; H10K 59/351; H10K 59/30; H10K 59/1201;
(Continued)

(56) References Cited

U.S. PATENT DOCUMENTS 6,839,108 B1    1/2005   Hirakata et al.
7,399,993 B2    7/2008   Matsuda
(Continued)

FOREIGN PATENT DOCUMENTS

CN    101661951 A    3/2010
JP    2001-071558 A   3/2001
(Continued)

OTHER PUBLICATIONS

Nozawa et al., English machine translated fo JP Application No. JP2013-118567, Jun. 5, 2013; (Machine translated Jan. 11, 2016).
(Continued)

*Primary Examiner* — Mohsen Ahmadi
(74) *Attorney, Agent, or Firm* — Oliff PLC

(57) ABSTRACT

A light emitting device includes a transistor, a light reflection layer, a first insulation layer that includes a first layer thickness part, a second layer thickness part, and a third layer thickness part, a pixel electrode that is provided on the first insulation layer, a second insulation layer that covers a peripheral section of the pixel electrode, a light emission functional layer, a facing electrode, and a conductive layer that is provided on the first layer thickness part. The pixel electrode includes a first pixel electrode which is provided in the first layer thickness part, a second pixel electrode which is provided in the second layer thickness part, and a third pixel electrode which is provided in the third layer thickness part. The first pixel electrode, the second pixel electrode, and the third pixel electrode are connected to the transistor through the conductive layer.

19 Claims, 19 Drawing Sheets

Related U.S. Application Data continuation of application No. 16/057,026, filed on Aug. 7, 2018, now Pat. No. 10,714,555, which is a continuation of application No. 15/233,424, filed on Aug. 10, 2016, now Pat. No. 10,074,708, which is a continuation of application No. 14/823,656, filed on Aug. 11, 2015, now Pat. No. 9,443,919, which is a division of application No. 14/455,566, filed on Aug. 8, 2014, now Pat. No. 9,142,599.

(51) Int. Cl.

| | |
|---|---|
| H10K 50/856 | (2023.01) |
| H10K 59/123 | (2023.01) |
| H10K 59/35 | (2023.01) |
| H10K 50/805 | (2023.01) |
| H10K 59/12 | (2023.01) |
| H10K 50/824 | (2023.01) |
| H10K 102/00 | (2023.01) |
| H10K 59/38 | (2023.01) |
| H10K 59/124 | (2023.01) |
| H10K 59/126 | (2023.01) |
| H10K 50/00 | (2023.01) |
| H10K 50/818 | (2023.01) |
| H10K 59/30 | (2023.01) |

(52) U.S. Cl.
CPC ......... *H10K 59/123* (2023.02); *H10K 59/124* (2023.02); *H10K 59/126* (2023.02); *H10K 59/35* (2023.02); *H10K 59/38* (2023.02); *H10K 50/00* (2023.02); *H10K 50/805* (2023.02); *H10K 50/818* (2023.02); *H10K 50/824* (2023.02); *H10K 59/1201* (2023.02); *H10K 59/30* (2023.02); *H10K 59/351* (2023.02); *H10K 2102/3026* (2023.02); *H10K 2102/341* (2023.02)

(58) Field of Classification Search
CPC .. H10K 59/123; H10K 59/126; H10K 59/124; H10K 59/38; H10K 50/856; H10K 50/818; H10K 50/824; H10K 50/805; H10K 50/852; H10K 51/50
See application file for complete search history.

(56) References Cited

U.S. PATENT DOCUMENTS

| | | | |
|---|---|---|---|
| 7,480,014 B2 | 1/2009 | Chae et al. | |
| 7,508,004 B2 | 3/2009 | Ishiguro | |
| 7,622,865 B2 | 11/2009 | Kobayashi | |
| 8,598,782 B2 | 12/2013 | Shinto | |
| 8,614,546 B2 | 12/2013 | Utsunomiya et al. | |
| 8,896,793 B2 | 11/2014 | Hara et al. | |
| 8,952,360 B2 | 2/2015 | Oh et al. | |
| 9,064,450 B2 | 6/2015 | Kashiwabara | |
| 9,236,419 B2* | 1/2016 | Kim | H10K 50/856 |
| 9,269,924 B2 | 2/2016 | Nozawa et al. | |
| 9,406,735 B2 | 8/2016 | Wang et al. | |
| 2003/0201447 A1 | 10/2003 | Yamazaki et al. | |
| 2003/0201716 A1 | 10/2003 | Yamazaki et al. | |
| 2005/0142976 A1 | 6/2005 | Suzuki | |
| 2005/0260804 A1 | 11/2005 | Kang et al. | |
| 2006/0114400 A1 | 6/2006 | Hung et al. | |
| 2007/0045621 A1 | 3/2007 | Suzuki et al. | |
| 2007/0102737 A1 | 5/2007 | Kashiwabara et al. | |
| 2007/0120188 A1 | 5/2007 | Kubota et al. | |
| 2007/0132368 A1* | 6/2007 | Kuwahara | H10K 50/824 313/506 |
| 2008/0136990 A1 | 6/2008 | Kimura | |
| 2008/0252207 A1 | 10/2008 | Yamazaki et al. | |
| 2009/0072693 A1 | 3/2009 | Cok et al. | |
| 2009/0085478 A1 | 4/2009 | Cok et al. | |
| 2009/0091238 A1 | 4/2009 | Cok et al. | |
| 2009/0212295 A1 | 8/2009 | Kang et al. | |
| 2009/0275176 A1 | 11/2009 | Kang et al. | |
| 2009/0283786 A1 | 11/2009 | Kobayashi et al. | |
| 2010/0019654 A1 | 1/2010 | Hayashi | |
| 2010/0052524 A1 | 3/2010 | Kinoshita | |
| 2010/0053038 A1 | 3/2010 | Sakamoto | |
| 2010/0096633 A1 | 4/2010 | Hatano et al. | |
| 2010/0253222 A1 | 10/2010 | Koshihara | |
| 2011/0220901 A1* | 9/2011 | Ha | H10K 50/15 257/59 |
| 2011/0284898 A1 | 11/2011 | Iwasaki | |
| 2011/0317429 A1 | 12/2011 | Aiba et al. | |
| 2012/0098013 A1 | 4/2012 | Yamazaki et al. | |
| 2012/0146143 A1 | 6/2012 | Kang et al. | |
| 2012/0261684 A1 | 10/2012 | Koshihara | |
| 2012/0262654 A1 | 10/2012 | Moriwaki | |
| 2013/0037818 A1 | 2/2013 | Lee et al. | |
| 2013/0120338 A1 | 5/2013 | Kubota et al. | |
| 2014/0027792 A1 | 1/2014 | Iwasaki et al. | |
| 2014/0027803 A1 | 1/2014 | Yamazaki et al. | |
| 2014/0034994 A1 | 2/2014 | Yamane et al. | |
| 2014/0118674 A1 | 5/2014 | Izawa | |
| 2014/0179041 A1* | 6/2014 | Huh | H10K 50/844 438/28 |
| 2014/0217432 A1* | 8/2014 | Ota | H10K 59/1315 257/89 |
| 2014/0231778 A1 | 8/2014 | Koshihara | |
| 2014/0340363 A1 | 11/2014 | Ikeda et al. | |
| 2014/0346480 A1 | 11/2014 | Fukuda et al. | |
| 2014/0346492 A1 | 11/2014 | Yamazaki et al. | |
| 2014/0361290 A1 | 12/2014 | Yamazaki et al. | |
| 2014/0361316 A1 | 12/2014 | Nozawa et al. | |
| 2015/0208480 A1 | 7/2015 | Hosokawa et al. | |
| 2016/0343793 A1 | 11/2016 | Yamazaki et al. | |

FOREIGN PATENT DOCUMENTS

| | | |
|---|---|---|
| JP | 2003-317971 A | 11/2003 |
| JP | 2005-189274 A | 7/2005 |
| JP | 2005-340168 A | 12/2005 |
| JP | 2007-026972 A | 2/2007 |
| JP | 2007-234301 A | 9/2007 |
| JP | 2009-134067 A | 6/2009 |
| JP | 2010-056015 A | 3/2010 |
| JP | 2010-056016 A | 3/2010 |
| JP | 2010-067517 A | 3/2010 |
| JP | 2010-211984 A | 9/2010 |
| JP | 2010-232163 A | 10/2010 |
| JP | 2010-244693 A | 10/2010 |
| JP | 2010-251095 A | 11/2010 |
| JP | 2010-539653 A | 12/2010 |
| JP | 2010-541160 A | 12/2010 |
| JP | 2010-541180 A | 12/2010 |
| JP | 2011-139995 A | 7/2011 |
| JP | 2011-141990 A | 7/2011 |
| JP | 2012-227247 A | 11/2012 |
| JP | 2012-248517 A | 12/2012 |

OTHER PUBLICATIONS

Nov. 9, 2022 Notice of Allowance issued in U.S. Appl. No. 17/897,879.

* cited by examiner

LIGHT EMITTING DEVICE AND ELECTRONIC EQUIPMENT INCLUDING A LIGHT REFLECTION LAYER, AN INSULATION LAYER, AND A PLURALITY OF PIXEL ELECTRODES

This is a Continuation of application Ser. No. 16/891,482 filed Jun. 3, 2020, which is a Continuation of application Ser. No. 16/057,026 filed Aug. 7, 2018, which is a Continuation of application Ser. No. 15/233,424 filed Aug. 10, 2016, which is a Continuation of application Ser. No. 14/823,656 filed Aug. 11, 2015, which is a Divisional of application Ser. No. 14/455,566 filed Aug. 8, 2014, which claims the benefit of Japanese Application No. 2013-175339 filed Aug. 27, 2013. The disclosures of the aforementioned prior applications are hereby incorporated by reference herein in their entirety.

BACKGROUND

1. Technical Field

The present invention relates to a light emitting device, a method of manufacturing the light emitting device, and electronic equipment in which the light emitting device is mounted.

2. Related Art

As an example of a light emitting device, for example, an electro-optic device, in which organic Electroluminescent (hereinafter, referred to as an organic EL) elements are arranged in a matrix shape (JP-A-2009-134067), has been proposed. The electro-optic device disclosed in JP-A-2009-134067 is an active matrix type light emitting device which includes a thin film transistor and in which pixels for emitting light are arranged in a matrix shape. In the pixels, a light reflection layer, a translucent insulation film, a first electrode (pixel electrode), a barrier layer, a light emission functional layer, and a second electrode (facing electrode) are sequentially laminated.

A current is supplied to the light emission functional layer from the pixel electrode in an area which is not covered by the barrier layer, and thus the light emission functional layer emits light. That is, an area which is not covered by the barrier layer (an area in which the barrier layer is not formed) is a light emission area. Further, the pixel electrode is provided to cover a contact hole, and the pixel electrode is electrically connected to the thin film transistor through the contact hole. That is, a portion, in which the pixel electrode is electrically connected to the thin film transistor, is a contact area. The pixel electrode is provided over the light emission area and the contact area.

A translucent insulation film has a function to adjust an optical distance between the light reflection layer and the facing electrode, and the film thickness of the translucent insulation film is set such that a relationship of the light emission area of a first pixel>the light emission area of a second pixel>the light emission area of a third pixel>a contact hole formation area (contact area), is satisfied.

With the configuration (optical resonance structure), light which is emitted from the light emission functional layer reciprocates between the light reflection layer and the facing electrode, and light of a resonant wavelength according to an optical distance between the light reflection layer and the facing electrode, that is, the film thickness of the translucent insulation film, is selectively amplified and emitted from each pixel. In the electro-optic device disclosed in JP-A-2009-134067, for example, light of a red wavelength in which a peak wavelength is 610 nm, light of a green wavelength in which a peak wavelength is 540 nm, and light of a blue wavelength in which a peak wavelength is 470 nm, that is, light of a high color purity is emitted from each pixel as display light according to the optical resonance structure, and thus excellent color reproducibility is acquired.

As described above, since the electro-optic device disclosed in JP-A-2009-134067 has a relationship of the film thickness of the translucent insulation film in the light emission area>the film thickness of the translucent insulation film in the contact area, a boundary of a different optical distance (a boundary of a different film thickness of the translucent insulation film) is formed between the light emission area and the contact area.

In the electro-optic device disclosed in JP-A-2009-134067, if the light emission area is enlarged in order to acquire a brighter display, the boundary becomes an obstacle, and thus there is a problem in that it is difficult to enlarge the light emission area.

Specifically, if the light emission area is enlarged over the boundary, a part in which the optical distance is different is generated in the light emission area. If the optical distance is different, the resonant wavelength varies, with the result that light of a different resonant wavelength is emitted from the light emission area, and thus the color purity of light, which is emitted from the light emission area, is deteriorated. Therefore, there is a problem in that it is difficult to enlarge the light emission area over the boundary.

SUMMARY

The invention can be realized in the following forms or application examples.

Application Example 1

According to this application example, there is provided a light emitting device including: a transistor; a light reflection layer which is provided on an upper side of the transistor; a first insulation layer that covers the light reflection layer, and includes a first layer thickness part, a second layer thickness part which is thicker than the first layer thickness part, and a third layer thickness part which is thicker than the second layer thickness part; a pixel electrode that is provided on the first insulation layer, and has optical transparency; a second insulation layer that covers a peripheral section of the pixel electrode; a light emission functional layer that covers the pixel electrode and the second insulation layer; a facing electrode that covers the light emission functional layer, and has light reflexivity and the optical transparency; and a conductive layer that is provided on the first layer thickness part, and includes at least a part which is superimposed on the pixel electrode in a plane view. The pixel electrode includes a first pixel electrode which is provided in the first layer thickness part, a second pixel electrode which is provided in the second layer thickness part, and a third pixel electrode which is provided in the third layer thickness part. The first pixel electrode, the second pixel electrode, and the third pixel electrode are connected to the transistor through the conductive layer.

The conductive layer is provided on the first layer thickness part, and a signal from the transistor is provided to the pixel electrode through the conductive layer. The conductive layer is superimposed on the pixel electrode in a plane view, and an area in which the conductive layer is provided is a contact area in which the transistor is connected to the pixel electrode. The peripheral section of the pixel electrode is covered by the second insulation layer, a current is supplied from the pixel electrode in an area, which is not covered by the second insulation layer, to the light emission functional layer according to the signal from the transistor, and the light emission functional layer emits light. That is, the area, which is not covered by the second insulation layer, is a light emission area in which the light emission functional layer emits light. The pixel electrode is provided over the contact area and the light emission area.

Light, which is emitted from the light emission functional layer (light emission area), reciprocates between the light reflection layer and the facing electrode, and resonates according to an optical distance between the light reflection layer and the facing electrode, and thus light, which has a specific wavelength, is amplified. The optical distance varies according to the layer thicknesses of the first insulation layer. Since the first insulation layer includes three layer thicknesses, light of three types of resonant wavelengths is emitted. When the layer thicknesses of the first insulation layer are adjusted such that, for example, light of three types of resonant wavelengths, that is, blue, green, and red, is amplified, it is possible to enhance the color purity of the blue, green and red light which is emitted from the light emission area.

The first pixel electrode is provided in the first layer thickness part, the second pixel electrode is provided in the second layer thickness part, and the third pixel electrode is provided in the third layer thickness part. The layer thicknesses of the first insulation layer in an area in which each pixel electrode is provided is fixed. That is, the optical distance of an area, in which the pixel electrode is provided, is fixed.

The optical distance of an area, in which the pixel electrode is provided, is fixed. Therefore, even when a gap between the light emission area and the contact area of the pixel electrode is reduced and the light emission area of the pixel electrode is enlarged, the optical distance does not vary. In other words, the area, in which the pixel electrode is provided, includes a boundary of a different optical distance in the well-known technique (JP-A-2009-134067). However, the optical distance is fixed in the area, in which the pixel electrode is provided, in the invention. Therefore, even when the light emission area is enlarged in the pixel electrode, the variation in the resonant wavelength (deterioration in the color purity) is not generated, and thus it is possible to enlarge the light emission area, compared to the well-known technique. Accordingly, it is possible to enhance the intensity of light which is emitted from the light emission area without deteriorating the color purity of light which is emitted from the light emission area. Therefore, in the light emitting device according to the application example, it is possible to provide a display with enhanced color purity and intensity of light, that is, display with brighter and clearer colors.

Application Example 2

In the light emitting device according to the application example, the first insulation layer may include a first insulation film, a second insulation film, and a third insulation film which are sequentially laminated from a side of the reflection layer, the first insulation film may have a first layer thickness, a part, in which the first insulation film and the second insulation film are laminated, may have a second layer thickness, a part, in which the first insulation film, the second insulation film, and the third insulation film are laminated, may have a third layer thickness, the conductive layer may include a first conductive layer, a second conductive layer, and a third conductive layer, the first pixel electrode may be directly connected to the first conductive layer, the second pixel electrode may be connected to the second conductive layer through a first contact hole which passes through the second insulation film, and the third pixel electrode may be connected to the third conductive layer through a second contact hole which passes through the second insulation film and the third insulation film.

The first layer thickness part includes the first insulation film, the second layer thickness part includes the first insulation film and the second insulation film, and the third layer thickness part includes the first insulation film, the second insulation film, and the third insulation film. Control is performed such that the first insulation film, the second insulation film, and the third insulation film have a uniform film thickness, and thus it is possible to enhance the uniformity of the film thickness of the first layer thickness part, the film thickness of the second layer thickness part, and the film thickness of the third layer thickness part. Accordingly, the uniformity of the optical distance of the area, in which the first pixel electrode is provided, the optical distance of the area, in which the second pixel electrode is provided, and the optical distance of the area, in which the third pixel electrode is provided, is enhanced, the deviation of the resonant wavelength of the light which is emitted from each pixel electrode is reduced, and thus it is possible to enhance the color purity of the light which is emitted from the light emission area of each pixel electrode.

Application Example 3

In the light emitting device according to the application example, the first pixel electrode may be provided in the first layer thickness part, and the second pixel electrode may be provided in the second layer thickness part.

When the first pixel electrode is arranged within the first layer thickness part, it is possible to emit light, which has the resonant wavelength corresponding to the first layer thickness part, from the light emission area of the first pixel electrode. When the second pixel electrode is arranged within the second layer thickness part, it is possible to emit light, which has the resonant wavelength corresponding to the second layer thickness part, from the light emission area of the second pixel electrode. Accordingly, it is possible to enhance the color purity of light which is emitted from the light emission areas of the first pixel electrode and the second pixel electrode.

Application Example 4

In the light emitting device according to the application example, the first pixel electrode, the second pixel electrode, and the third pixel electrode may be arranged in parallel in a first direction, and the first layer thickness part and the second layer thickness part may be formed in a rectangular shape which is extended in a second direction crossing the first direction.

The first layer thickness part is arranged with the first pixel electrode, and emits light of a first resonant wavelength. The second layer thickness part is arranged with the second pixel electrode, and emits light of a second resonant wavelength. The third layer thickness part is provided with the third pixel electrode, and emits light of a third resonant wavelength. A part which emits light of the first resonant wavelength, a part which emits light of the second resonant wavelength, and a part which emits light of the third resonant wavelength have a rectangular shape which is extended in the second direction. When the part (first layer thickness part) which emits light of the first resonant wavelength, the part (second layer thickness part) which emits light of the second resonant wavelength, and the part (third layer thickness part) which emits light of the third resonant wavelength are repeatedly arranged in the first direction crossing the second direction, it is possible to form the light emission area (display area) in which parts which emit three types of colors are arranged in a stripe shape.

Application Example 5

In the light emitting device according to the application example, the first insulation layer may include a first insulation film and an organic insulation layer which are sequentially laminated onto a side of the light reflection layer, the organic insulation layer may include a first flat section and a second flat section which is thicker than the first flat section, the first insulation film may include a first layer thickness, a part, in which the first insulation film and the first flat section are laminated, may have a second layer thickness, a part, in which the first insulation film and the second flat section are laminated, may have a third layer thickness, the conductive layer may include a first conductive layer, a second conductive layer, and a third conductive layer, the first pixel electrode may be directly connected to the first conductive layer, the second pixel electrode may be connected to the second conductive layer through a first contact hole which passes through the first flat section, and the third pixel electrode may be connected to the third conductive layer through a second contact hole which passes through the second flat section.

Since it is possible to form the organic insulation layer using an inexpensive coating or printing apparatus, it is possible to inexpensively form the organic insulation layer compared to an inorganic insulation layer (for example, silicon oxide) which is formed using an expensive plasma CVD apparatus or a sputtering apparatus.

Application Example 6

In the light emitting device according to the application example, the organic insulation layer may include a first organic insulation film and a second organic insulation film which are formed of a photosensitive resin material, and the first flat section may include the first organic insulation film, and the second flat section may include the first organic insulation film and the second organic insulation film.

Since it is possible to perform patterning through only a photolithographic process using a photosensitive resin material in the organic insulation film, the process is simplified compared to a method of patterning the inorganic insulation film (for example, silicon oxide) which requires an etching process in addition to the photolithographic process, and thus it is possible to enhance productivity.

Application Example 7

According to this Application Example, there is provided a light emitting device including: a first transistor; a second transistor; a third transistor; a light reflection layer that is provided on upper sides of the first transistor, the second transistor, and the third transistor; a first insulation layer that covers the light reflection layer, and includes a first layer thickness part, a second layer thickness part which is thicker than the first layer thickness part, and a third layer thickness part which is thicker than the second layer thickness part; a first pixel electrode that is provided on the first layer thickness part; a first relay electrode that is electrically connected to the first transistor; a second pixel electrode that is provided on the second layer thickness part; a second relay electrode that is electrically connected to the second transistor; a third pixel electrode that is provided on the third layer thickness part; a third relay electrode that is electrically connected to the third transistor; a facing electrode; and a light emission functional layer that is provided between the first pixel electrode and the facing electrode, between the second pixel electrode and the facing electrode, and between the third pixel electrode and the facing electrode. The first relay electrode is connected to the first pixel electrode through a first connection part which is provided in the first layer thickness part, the second relay electrode is connected to the second pixel electrode through a second connection part which is provided in the second layer thickness part, and the third relay electrode is connected to the third pixel electrode through a third connection part which is provided in the third layer thickness part.

Thereby, it is possible to reduce the gap between the light emission area and the contact area of the pixel electrode, and to enlarge the light emission area of the pixel electrode. Accordingly, in the light emitting device according to the application example, it is possible to provide a display with enhanced color purity and intensity of light, that is, a display with brighter and clearer colors.

Application Example 8

In the light emitting device according to the application example, the light emitting device may further include: a second insulation layer that defines a first light emission area on the first pixel electrode, defines a second light emission area on the second pixel electrode, and defines a third light emission area on the third pixel electrode. The first light emission area may be provided on the first layer thickness part, the second light emission area may be provided on the second layer thickness part, and the third light emission area may be provided on the third layer thickness part.

Application Example 9

In the light emitting device according to the application example, the first layer thickness part may be provided to reach the first connection part from the first light emission area, the second layer thickness part may be provided to reach the second connection part from the second light emission area, and the third layer thickness part may be provided to reach the third connection part from the third light emission area.

Application Example 10

The light emitting device according to the application example may further include a fourth light emission area, and the second layer thickness part may be provided over the second light emission area and the fourth light emission area.

Application Example 11

In the light emitting device according to the application example, the first layer thickness part may be provided to surround the first connection part, the second layer thickness part may be provided to surround the second connection part, and the third layer thickness part may be provided to surround the third connection part.

Application Example 12

In the light emitting device according to the application example, the first insulation layer may include a first insulation film, a second insulation film, and a third insulation film which are sequentially laminated from a side of the reflection layer, the first connection part may include a first conductive layer which is connected to the first relay electrode through a first contact hole which passes through the first insulation film, and is connected to the first pixel electrode, the second connection part may include a second conductive layer which is connected to the second relay electrode through a second contact hole which passes through the first insulation film, and is connected to the second pixel electrode through a third contact hole which passes through the second insulation film, and the third connection part may include a third conductive layer which is connected to the third relay electrode through a fourth contact hole which passes through the first insulation film, and is connected to the third pixel electrode through a fifth contact hole which passes through the second insulation film and the third insulation film.

Application Example 13

The light emitting device according to the application example may further include: a fourth transistor; a fourth pixel electrode that is provided on the second layer thickness part; and a fourth relay electrode that is electrically connected to the fourth transistor. The fourth relay electrode may be connected to the fourth pixel electrode through a fourth connection part which is provided in the second layer thickness part, and the first insulation film and the second insulation film may be provided to be buried between the second connection part and the fourth connection part.

Application Example 14

According to this application example, there is provided electronic equipment including the light emitting device according to the application examples.

Since the electronic equipment according to the application example includes the light emitting device according to the application examples, it is possible to supply a bright and clear display. For example, it is possible to apply the light emitting device according to the application examples to electronic equipment which includes, for example, a display unit, such as a head mounted display, a head up display, an electronic viewfinder of a digital camera, a personal digital assistant, and a navigator.

Application Example 15

According to this application example, there is provided a method of manufacturing a light emitting device, which includes a transistor; a light reflection layer which is provided on an upper side of the transistor; a first insulation layer that covers the light reflection layer, and includes a first layer thickness part, a second layer thickness part, and a third layer thickness part; a pixel electrode that is provided on the first layer thickness part; a second insulation layer that covers a peripheral section of the pixel electrode; a light emission functional layer that covers the pixel electrode and the second insulation layer; a facing electrode that covers the light emission functional layer; and a conductive layer that is provided on the first layer thickness part, the pixel electrode including a first pixel electrode which is provided in the first layer thickness part, a second pixel electrode which is provided in the second layer thickness part, and a third pixel electrode which is provided in the third layer thickness part, and the first pixel electrode, the second pixel electrode, and the third pixel electrode being connected to the transistor through the conductive layer, the method including: forming the light reflection layer; forming a first insulation film to have the first layer thickness; forming the conductive layer; forming a second insulation film to have the second layer thickness between the first insulation film and the second insulation film; forming a third insulation film to have the third layer thickness between the first and second insulation films and the third insulation film; patterning the second insulation film and the third insulation film, and forming the first insulation layer which includes the first layer thickness part, the second layer thickness part, and the third layer thickness part; forming a first contact hole, which exposes a part of the conductive layer, in the second layer thickness part and a second contact hole, which exposes a part of the conductive layer, in the third layer thickness part; and forming the first pixel electrode, which is partially superimposed on the conductive layer, in the first layer thickness part, the second pixel electrode, which covers the first contact hole, in the second layer thickness part, and the third pixel electrode, which covers the second contact hole, in the third layer thickness part.

The light emitting device which is manufactured using the manufacturing method according to the application example includes a configuration in which the light reflection layer, the first insulation layer, the pixel electrode, the light emission functional layer, and the facing electrode are laminated. Light, which is emitted from the light emission functional layer, reciprocates between the light reflection layer and the facing electrode, resonates according to the optical distance between the light reflection layer and the facing electrode, and light, which has a specific wavelength, is amplified. The optical distance varies according to the layer thicknesses of the first insulation layer. Since the first insulation layer is formed to have three layer thicknesses, light of three types of specific wavelengths is emitted. For example, if the first insulation layer is formed such that light of three types of wavelengths, that is, blue, green, and red is selectively amplified, it is possible to enhance the color purity of the blue, green, and red light which is emitted from the light emission functional layer.

The first pixel electrode is formed in the first layer thickness part of the first insulation layer, the second pixel electrode is formed in the second layer thickness part of the first insulation layer, the third pixel electrode is formed in the third layer thickness part of the first insulation layer, each of the pixel electrodes is connected to the conductive layer, and the signal from the transistor is supplied through the conductive layer. Since the optical distance (the layer thicknesses of the first insulation layer) is fixed in the area in which each pixel electrode is formed, the variation in the resonant wavelength (deterioration of the color purity) is not generated even when the light emission area of the pixel electrode is enlarged. That is, compared to the well-known technique (JP-A-2009-134067) in which the area, in which the pixel electrode is provided, includes a boundary of different optical distance, it is possible to enlarge the light emission area without causing the color purity to be deteriorated and it is possible to enhance the intensity of light which is emitted from the light emission area. Accordingly, in the light emitting device according to the application example, it is possible to provide display with enhanced color purity and intensity of light, that is, display with brighter and clearer colors.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
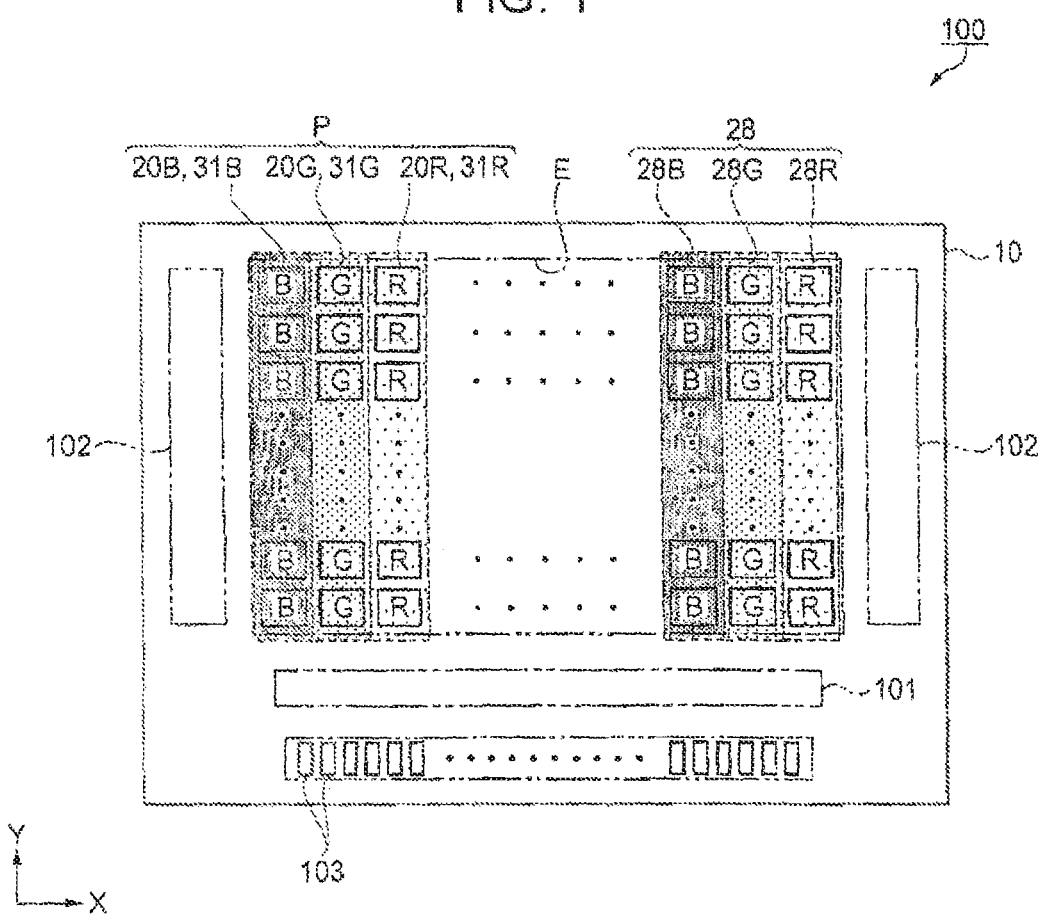
FIG. 1 is a schematic plane view illustrating the configuration of an organic EL apparatus according to a first embodiment.

Hereinafter, embodiments of the invention will be described with reference to the accompanying drawings. The embodiments illustrate one aspect of the invention, do not limit the invention, and can be arbitrarily modified within the technical gist of the invention. In addition, in each drawing below, each layer and each portion are illustrated in a size which can be recognized in the drawing, and thus the dimensions of each layer and each portion are made to be different from actual dimensions.

First Embodiment

Outline of Organic EL Apparatus

An organic EL apparatus 100 according to the first embodiment is an example of a light emitting device, and includes an optical resonance structure in which it is possible to enhance the color purity of display light.

Figure 2:
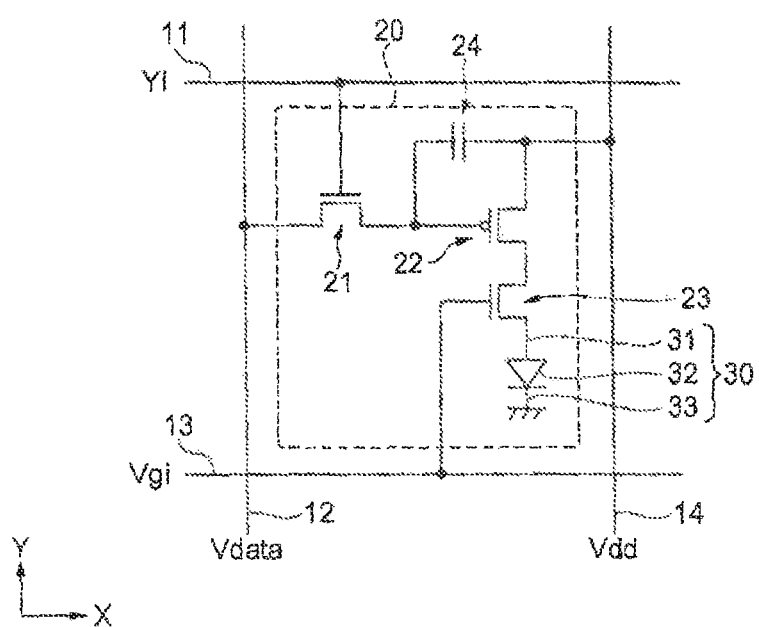
FIG. 2 is an equivalent circuit diagram illustrating the electrical configuration of the organic EL apparatus according to the first embodiment.

First, the outline of the organic EL apparatus 100 according to the embodiment will be described with reference to FIGS. 1 to 3. FIG. 1 is a schematic plane view illustrating the configuration of the organic EL apparatus, FIG. 2 is an equivalent circuit diagram illustrating the electrical configuration of the organic EL apparatus, and FIG. 3 is a schematic plane view illustrating a characteristic portion of the light emitting pixels.

Figure 3:
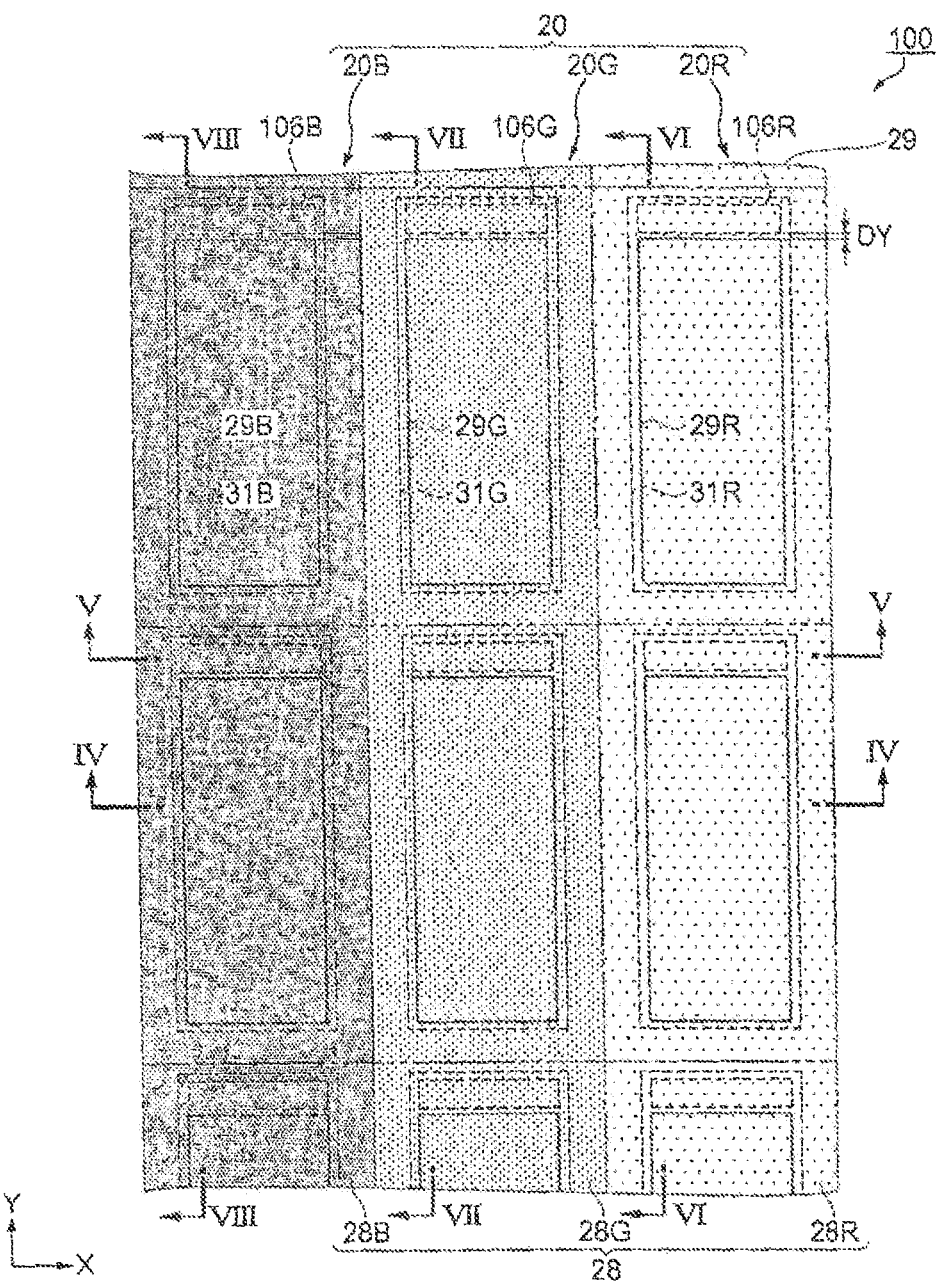
FIG. 3 is a schematic plane view illustrating a characteristic portion of light emitting pixels.

Meanwhile, FIG. 3 illustrates components which are necessary to describe the characteristic portion of the light emitting pixels and does not illustrate the other components. In addition, in FIG. 3, two-dot dashed lines show the outlines of the light emitting pixels 20.

As shown in FIG. 1, the organic EL apparatus 100 according to the embodiment includes an element substrate 10 as a substrate, a plurality of light emitting pixels 20B, 20G, and 20R which are arranged in a matrix shape on the display area E of the element substrate 10, a data line drive circuit 101 and scan line drive circuits 102, which are peripheral circuits for controlling the drive of the plurality of light emitting pixels 20B, 20G, and 20R, external connection terminals 103 which are electrically connected to external circuits, and the like.

A plurality of external connection terminals 103 are arranged along the first side of the element substrate 10. The data line drive circuit 101 is provided between the plurality of external connection terminals 103 and the display area E. The scan line drive circuits 102 are provided between a second side and a third side, which are perpendicular to the first side and face each other, and the display area E.

Hereinafter, description will be made in such a way that a direction along the first side is an X direction and a direction along the other two sides (the second side and the third side), which are perpendicular to the first side and face each other, is a Y direction.

Meanwhile, the X direction is an example of a "first direction" in the invention, and the Y direction is an example of a "second direction" in the invention.

The organic EL apparatus 100 includes a light emitting pixel 20B in which blue color (B) light emission can be acquired, a light emitting pixel 20G in which green color (G) light emission can be acquired, and a light emitting pixel 20R in which red color (R) light emission can be acquired. In the organic EL apparatus 100, the light emitting pixel 20B, the light emitting pixel 20G, and the light emitting pixel 20R which are arranged in the X direction form a display unit P, and full color display is provided.

Further, the light emitting pixel 20B includes a pixel electrode 31B, the light emitting pixel 20G includes a pixel electrode 31G, and the light emitting pixel 20R includes a pixel electrode 31R. Each of the light emitting pixel 20B (pixel electrode 31B), the light emitting pixel 20G (pixel electrode 31G), and the light emitting pixel 20R (pixel electrode 31R) is arranged in parallel in the Y direction.

Meanwhile, the pixel electrode 31B is an example of a "first pixel electrode" in the invention, the pixel electrode 31G is an example of a "second pixel electrode" in the invention, and the pixel electrode 31R is an example of a "third pixel electrode" in the invention.

In description below, there is a case in which the light emitting pixel is called the light emitting pixels 20B, 20G, and 20R and the pixel electrode is called the pixel electrodes 31B, 31G, and 31R, or a case in which the pixels and the pixel electrodes are collectively called a light emitting pixel 20 and a pixel electrode 31.

In the Y direction, the light emitting pixels 20, in which the same color light emission is acquired, are arranged. That is, the light emitting pixels 20B, in which blue color (B) light emission is acquired, are arranged in the Y direction and form a rectangular shape (stripe shape). The light emitting pixels 20G, in which green color (G) light emission is acquired, are arranged in the Y direction and form a rectangular shape (stripe shape). The light emitting pixels 20R, in which red color (R) light emission is acquired, are arranged in the Y direction and form a rectangular shape (stripe shape).

In the X direction, the light emitting pixels 20, in which different color light emission is acquired, are repeatedly arranged in the order of B, G, and R. Meanwhile, the arrangement of the light emitting pixels 20 in the X direction may be arranged in the order of, for example, R, G, and B instead of the order of B, G, and R.

The translucent first insulation layer 28 is provided on approximately the whole surface of the element substrate 10 except in an area in which the external connection terminals 103 are formed.

The translucent first insulation layer 28 includes a first area 28B in which the light emitting pixels 20B (pixel electrodes 31B) are arranged, a second area 28G in which the light emitting pixels 20G (pixel electrodes 31G) are arranged, and a third area 28R in which the light emitting pixels 20R (pixel electrode 31R) are arranged, and the layer thickness (film thickness) of the first insulation layer 28 differs in each area. Although description will be made in detail later, the film thickness of the first insulation layer 28 in the second area 28G is larger than the film thickness of the first insulation layer 28 in the first area 28B. The film thickness of the first insulation layer 28 in the third area 28R is larger than the film thickness of the first insulation layer 28 in the second area 28G. That is, the film thickness of the first insulation layer 28 becomes larger in the order of the first area 28B, the second area 28G, and the third area 28R.

The second area 28G is an example of a "first flat section" in the invention. The third area 28R is an example of a "second flat section" in the invention.

The first area 28B, the second area 28G, and the third area 28R extend in the Y direction and form a rectangular shape (stripe shape).

In the display area E, the dimensions of the first area 28B, the second area 28G, and the third area 28R in the X direction are approximately the same as the dimension of the light emitting pixel 20 in the X direction, that is, approximately the same as a repeating pitch of the light emitting pixel 20 in the X direction.

In the Y direction, the first area 28B, the second area 28G, and the third area 28R are wider than the display area E. That is, the dimensions of the first area 28B, the second area 28G, and the third area 28R in the Y direction are larger than the dimension of the display area E in the Y direction. Meanwhile, the dimensions of the first area 28B, the second area 28G, and the third area 28R in the Y direction may be the same as the dimension of the display area E in the Y direction, that is, the dimension of an area in which the light emitting pixel 20 is arranged.

The first insulation layer 28 is provided in the vicinity of the display area E (an area other than the first area 28B, the second area 28G, and the third area 28R). In the embodiment, the film thickness of the first insulation layer 28, which is provided in the vicinity of the display area E, is the same as the film thickness of the first insulation layer 28 of the third area 28R. Meanwhile, the film thickness of the first insulation layer 28, which is provided in the vicinity of the display area E, may be the same as the film thickness of the first insulation layer 28 of the first area 28B or the film thickness of the first insulation layer 28 of the second area 28G. Further, the first insulation layer 28, which is provided in the vicinity of the display area E, may have a different film thickness from those of the first insulation layers 28 of the first area 28B, the second area 28G, and the third area 28R.

Meanwhile, the first area 28B is an example of a "first layer thickness part" in the invention, the second area 28G is an example of a "second layer thickness part" in the invention, and the third area 28R is an example of a "third layer thickness part" in the invention.

As shown in FIG. 2, a scan line 11, a data line 12, a lighting control line 13, and a power line 14 are provided in the element substrate 10 as signal lines corresponding to the light emitting pixel 20. The scan line 11 and the lighting control line 13 extend in the X direction in parallel, and are connected to the scan line drive circuits 102 (FIG. 1). The data line 12 and the power line 14 extend in the Y direction in parallel. The data line 12 is connected to the data line drive circuit 101 (FIG. 1). The power line 14 is connected to any one of the external connection terminals 103 which are arranged in plural.

A first transistor 21, a second transistor 22, a third transistor 23, a storage capacitor 24, and an organic EL element 30, which form the pixel circuit of the light emitting pixel 20, are provided in the vicinity of the intersection of the scan line 11 and the data line 12.

The organic EL element 30 includes a pixel electrode 31 which is an anode, a facing electrode 33 which is a cathode, and a light emission functional layer 32 which includes a light emitting layer interposed between the electrodes. The facing electrode 33 is a common electrode which is provided over the plurality of light emitting pixels 20. For example, a reference potential Vss, a potential GND, or the like, which is lower than a power supply voltage Vdd which is applied to the power line 14, is applied to the facing electrode 33.

The first transistor 21 and the third transistor 23 are, for example, n-channel type transistors. The second transistor 22 is, for example, a p-channel type transistor.

The first transistor 21 includes a gate electrode which is connected to the scan line 11, one side current terminal which is connected to the data line 12, and the other side current terminal which is connected to the gate electrode of the second transistor 22 and one side electrode of the storage capacitor 24.

The second transistor 22 includes the one side current terminal which is connected to the power line 14 and is connected to the other side electrode of the storage capacitor 24. The second transistor 22 includes the other side current terminal which is connected to the onside current terminal of the third transistor 23. In other words, the second transistor 22 and the third transistor 23 share one current terminal of a pair of current terminals.

The third transistor 23 includes a gate electrode which is connected to the lighting control line 13, and the other side current terminal which is connected to the pixel electrode 31 of the organic EL element 30.

The pair of current terminals in each of the first transistor 21, the second transistor 22 and the third transistor 23 includes one side which is a source and the other side which is a drain.

Meanwhile, the third transistor 23 is an example of a "transistor" in the invention.

In such a pixel circuit, a voltage level of a scan signal Yi which is supplied from the scan line drive circuits 102 to the scan line 11 is a High level, and the re-channel type first transistor 21 becomes in the on-state (ON). The data line 12 is electrically connected to the storage capacitor 24 through the first transistor 21 which is in the on state (ON). Further, when a data signal is supplied from the data line drive circuit 101 to the data line 12, a potential difference between a voltage level Vdata of the data signal and the power supply voltage Vdd applied to the power line 14 is stored in the storage capacitor 24.

If the voltage level of the scan signal Yi, which is supplied from the scan line drive circuits 102 to the scan line 11, is a Low level, the n-channel type first transistor 21 is in the off-state (OFF), and a gate-source voltage Vgs of the second transistor 22 is maintained at a voltage acquired when the voltage level Vdata is applied. In addition, after the scan signal Yi becomes Low level, a voltage level of a lighting control signal Vgi, which is supplied to the lighting control line 13, becomes the high, and the third transistor 23 becomes in the on-state (ON). If so, a current according to the gate-source voltage Vgs of the second transistor 22, that is, a voltage which is maintained in the storage capacitor 24 is supplied from the power line 14 to the organic EL element 30 through the second transistor 22 and the third transistor 23.

The organic EL element 30 emits light according to the magnitude of the current which flows through the organic EL element 30. The current which flows through the organic EL element 30 changes depending on the voltage maintained in the storage capacitor 24 (potential difference between the voltage level Vdata of the data line 12 and the power supply voltage Vdd) and the length of a period in which the third transistor 23 becomes the on-state, and thus light emission brightness of the organic EL element 30 is defined. That is, it is possible to give gradation to the brightness according to image information in the light emitting pixel 20 based on a value of the voltage level Vdata of the data signal.

Meanwhile, in the embodiment, the pixel circuit of the light emitting pixel 20 is not limited to the structure which includes the three transistors 21, 22, and 23, and may have a structure which includes, for example, a switching transistor and a driving transistor (structure which includes two transistors). In addition, the transistors which form the pixel circuit may include an n-channel type transistor, a p-channel type transistor, or both the n-channel type transistor and the p-channel type transistor. In addition, the transistors which form the pixel circuit of the light emitting pixel 20 may include a MOS type transistor which has an active layer on a semiconductor substrate, a thin film transistor, or an electric field effect transistor.

In addition, the arrangement of the lighting control line 13 and the power line 14, which are signal lines other than the scan line 11 and the data line 12, depends on the arrangement of the transistors and the storage capacitor 24 but is not limited thereto.

In the embodiment, the MOS type transistor, which includes an active layer on the semiconductor substrate, is used as the transistor which forms the pixel circuit of the light emitting pixel 20.

Characteristic Portion of Light Emitting Pixel

Subsequently, the outline of a characteristic portion of the light emitting pixel 20 will be described with reference to FIG. 3.

As shown in FIG. 3, the light emitting pixel 20 includes a relay electrode 106, a pixel electrode 31, and a second insulation layer 29. In the light emitting pixel 20, the relay electrode 106, the pixel electrode 31, and the second insulation layer 29 are sequentially laminated (refer to FIGS. 5 and 6). The second insulation layer 29 includes openings 29B, 29G, and 29R which expose a part of the pixel electrode 31. A light emitting pixel 20B, in which blue color (B) light emission is acquired, includes a pixel electrode 31B, a relay electrode 106B, and the opening 29B. A light emitting pixel 20G, in which green color (G) light emission is acquired, includes a pixel electrode 31G, a relay electrode 106G, and the opening 29G. A light emitting pixel 20R, in which red color (R) light emission is acquired, includes a pixel electrode 31R, a relay electrode 106R, and the opening 29R.

In description below, there is a case in which the relay electrode is called the relay electrodes 106B, 106G, and 106R or a case in which the relay electrode is collectively called the relay electrode 106.

Meanwhile, the relay electrode 106 is an example of a "conductive layer" in the invention. The relay electrode 106B is an example of a "first conductive layer" in the invention, the relay electrode 106G is an example of a "second conductive layer" in the invention, and the relay electrode 106R is an example of a "third conductive layer" in the invention.

Each of the light emitting pixels 20B, 20G, and 20R has a rectangular shape in a plane view, and a longitudinal direction thereof is arranged along the Y direction. In the same manner, each of the pixel electrodes 31B, 31G, and 31R has a rectangular shape in a plane view, and a longitudinal direction thereof is arranged along the Y direction.

As shown in the same drawing, the relay electrode 106 is arranged along one short side of the rectangular-shaped light emitting pixel 20, and is provided such that at least one part thereof is superimposed on the pixel electrode 31 in a plane view. Although description will be made in detail later, the relay electrode 106 is a part of wiring which electrically connects the pixel electrode 31 to the third transistor 23. In other words, the pixel electrode 31 is connected to the third transistor 23 through the relay electrode 106. That is, an area in which the relay electrode 106 is provided is a contact area.

The second insulation layer 29 covers the peripheral section of the pixel electrode 31 and has a function to electrically insulate adjacent pixel electrodes 31. As described above, the second insulation layer 29 includes the openings 29B, 29G, and 29R each of which exposes a part of the pixel electrode 31. The pixel electrode 31 corresponding to a part which is exposed through the second insulation layer 29, that is, the pixel electrode 31 which is exposed through the openings 29B, 29G, and 29R is connected to the light emission functional layer 32, supplies a current to the light emission functional layer 32, and causes the light emission functional layer 32 to emit light. Therefore, the openings 29B, 29G, and 29R which are provided in the second insulation layer 29 become light emission areas of the light emitting pixels 20B, 20G, and 20R. In this manner, the second insulation layer 29 has a function to define the light emission area of the light emitting pixel 20.

Meanwhile, in the invention, the pixel electrode 31 includes at least an electrode portion which functions as the electrode of the organic EL element 30 by connecting to the light emission functional layer 32 in the light emission area (openings 29B, 29G, and 29R), and a conductive portion which functions as a conductive layer for connecting the electrode portion and the relay electrode 106 in a contact area which is connected to the transistor or the wiring.

Although description will be made in detail later, the light emitting pixel 20 according to the embodiment includes a configuration in which it is possible to reduce a distance DY between the light emission area (openings 29B, 29G, and 29R) and the contact area (relay electrodes 106B, 106G, and 106R). That is, the light emitting pixel 20 includes a configuration in which it is possible to enhance the intensity of light which is emitted from the light emission functional layer 32 by enlarging the light emission area (openings 29B, 29G, and 29R). This is the characteristic portion of the light emitting pixel 20.

Configuration of Cross Section of Light Emitting Pixel

Subsequently, the configuration of a cross section of the light emitting pixel 20 will be described with reference to FIGS. 4 to 8.

Figure 4:
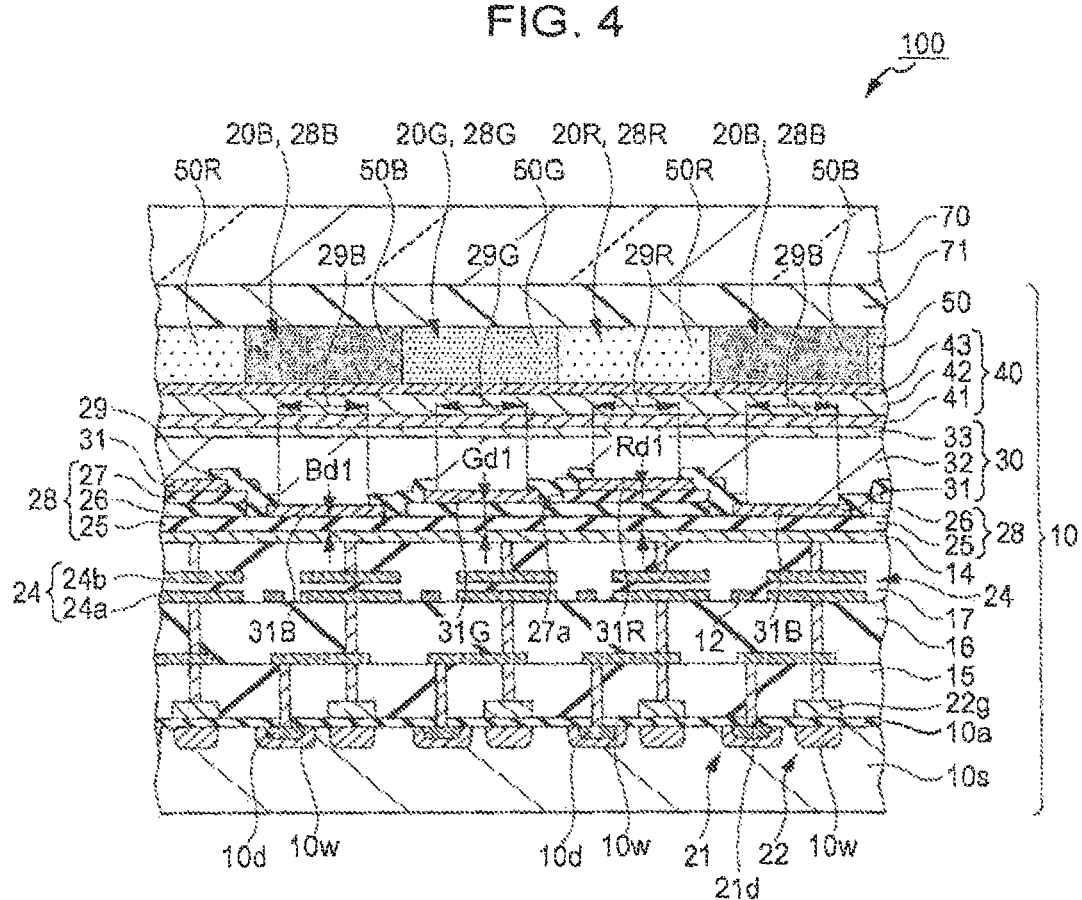
FIG. 4 is a schematic cross-sectional diagram taken along line IV-IV of FIG. 3.
Figure 5:
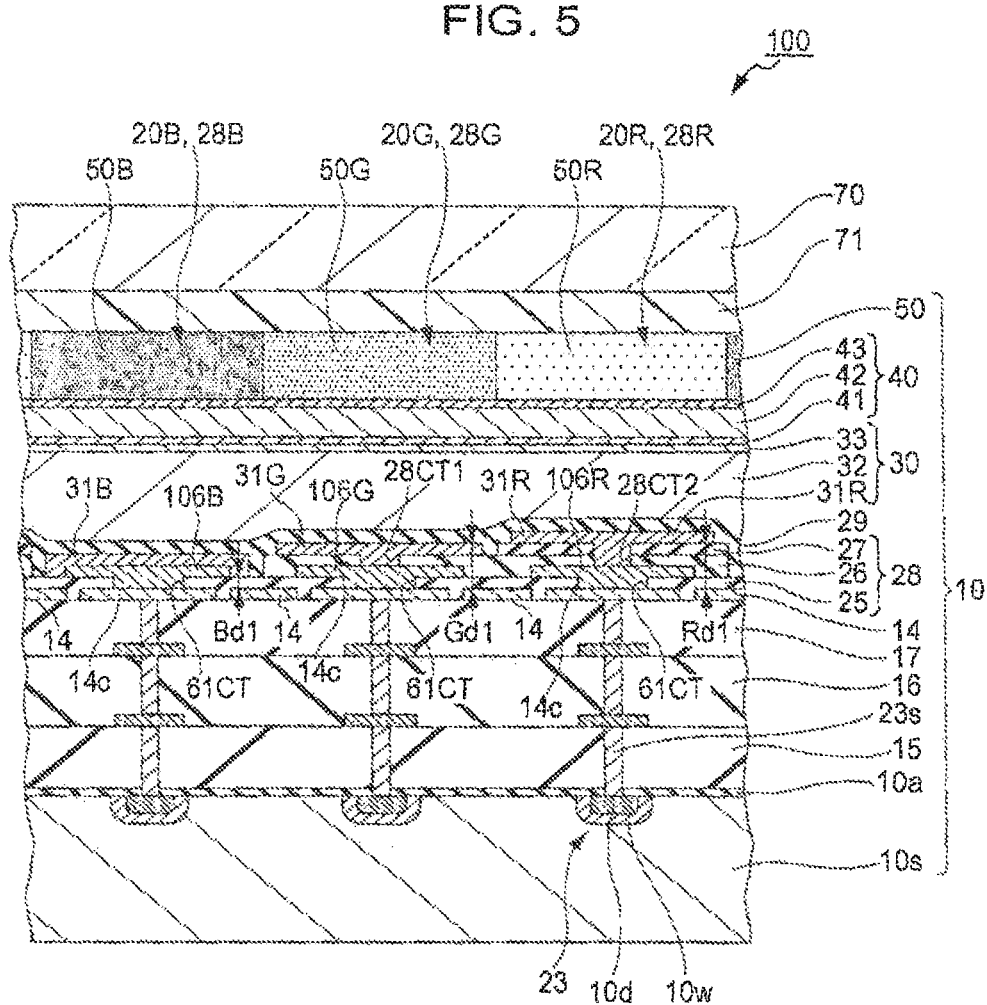
FIG. 5 is a schematic cross-sectional diagram taken along line V-V of FIG. 3.
Figure 6:
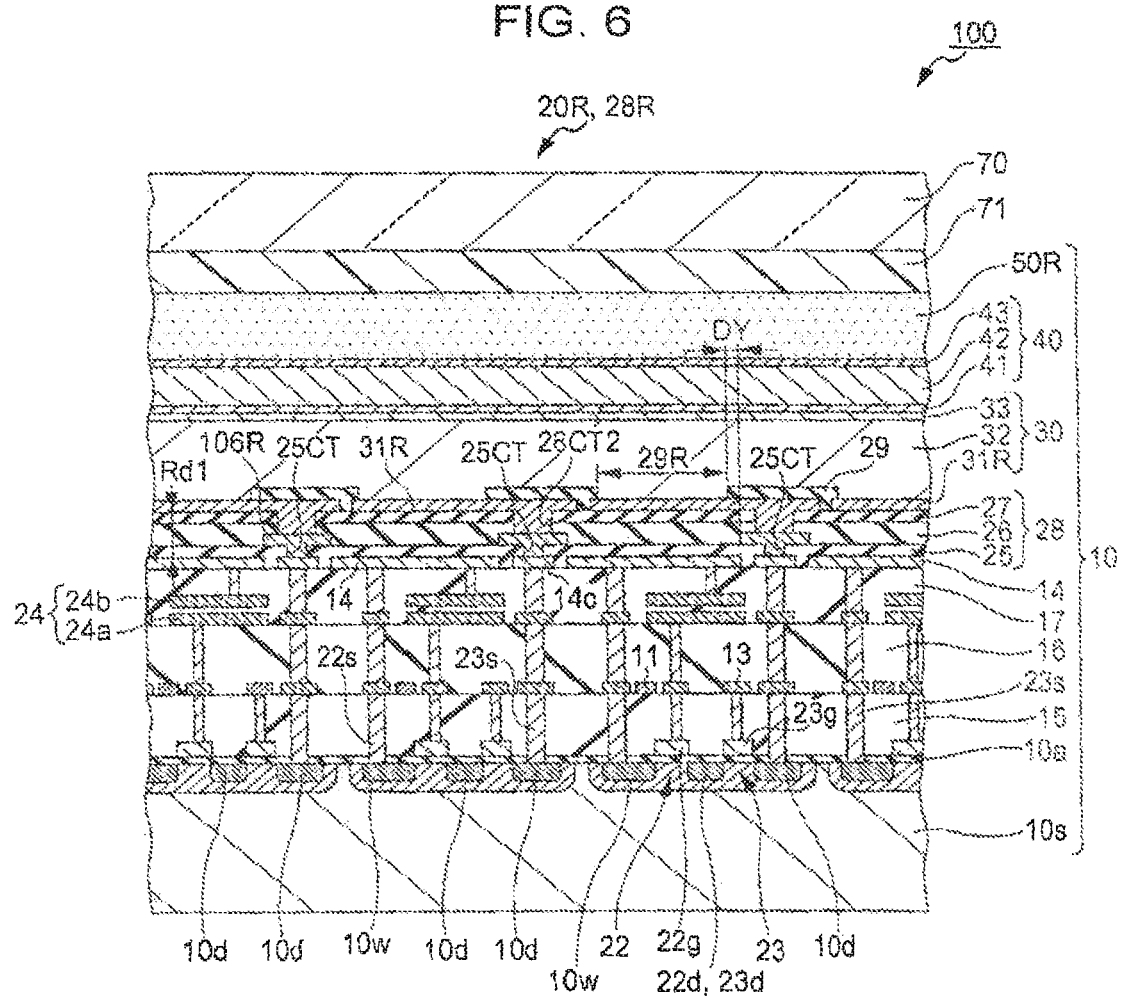
FIG. 6 is a schematic cross-sectional diagram taken along line VI-VI of FIG. 3.
Figure 7:
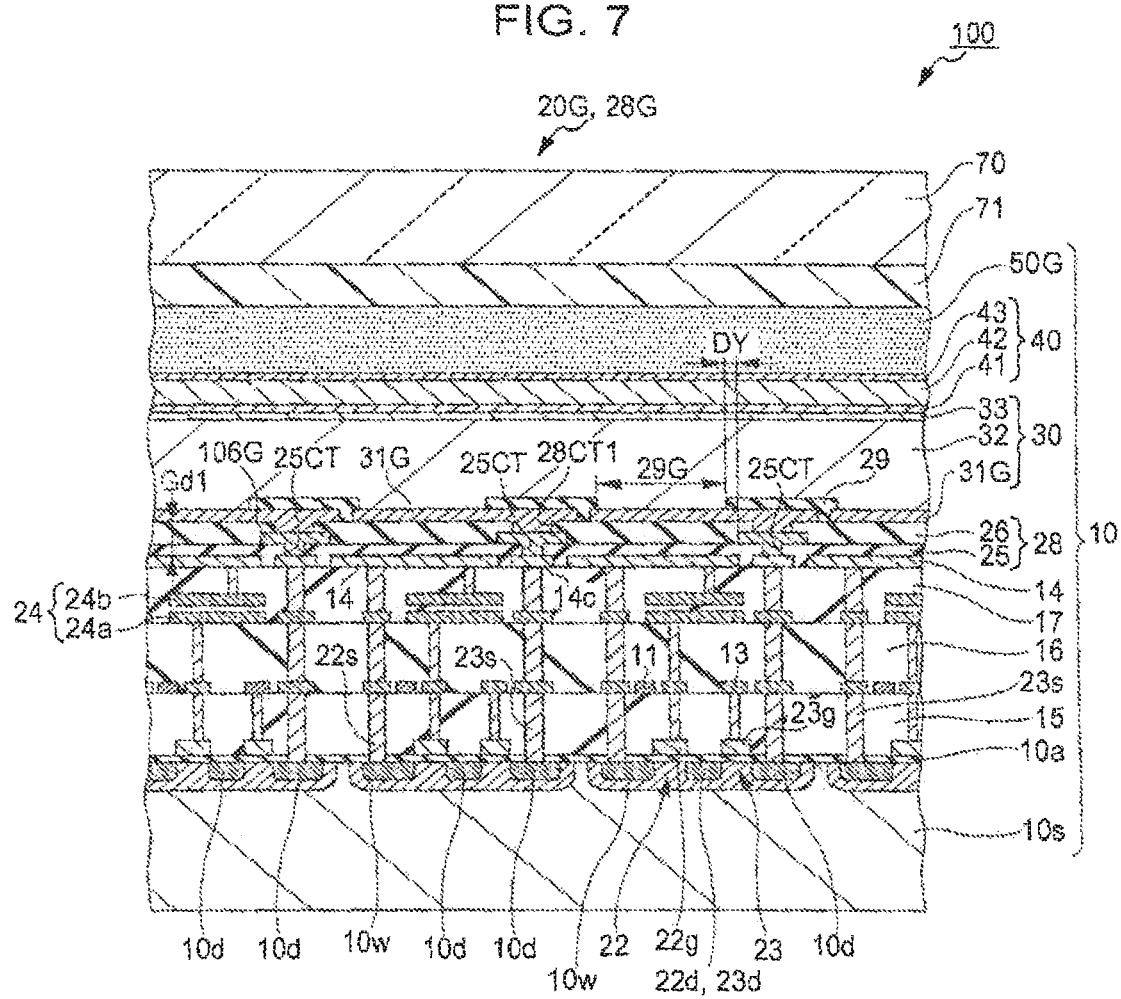
FIG. 7 is a schematic cross-sectional diagram taken along line VII-VII of FIG. 3.
Figure 8:
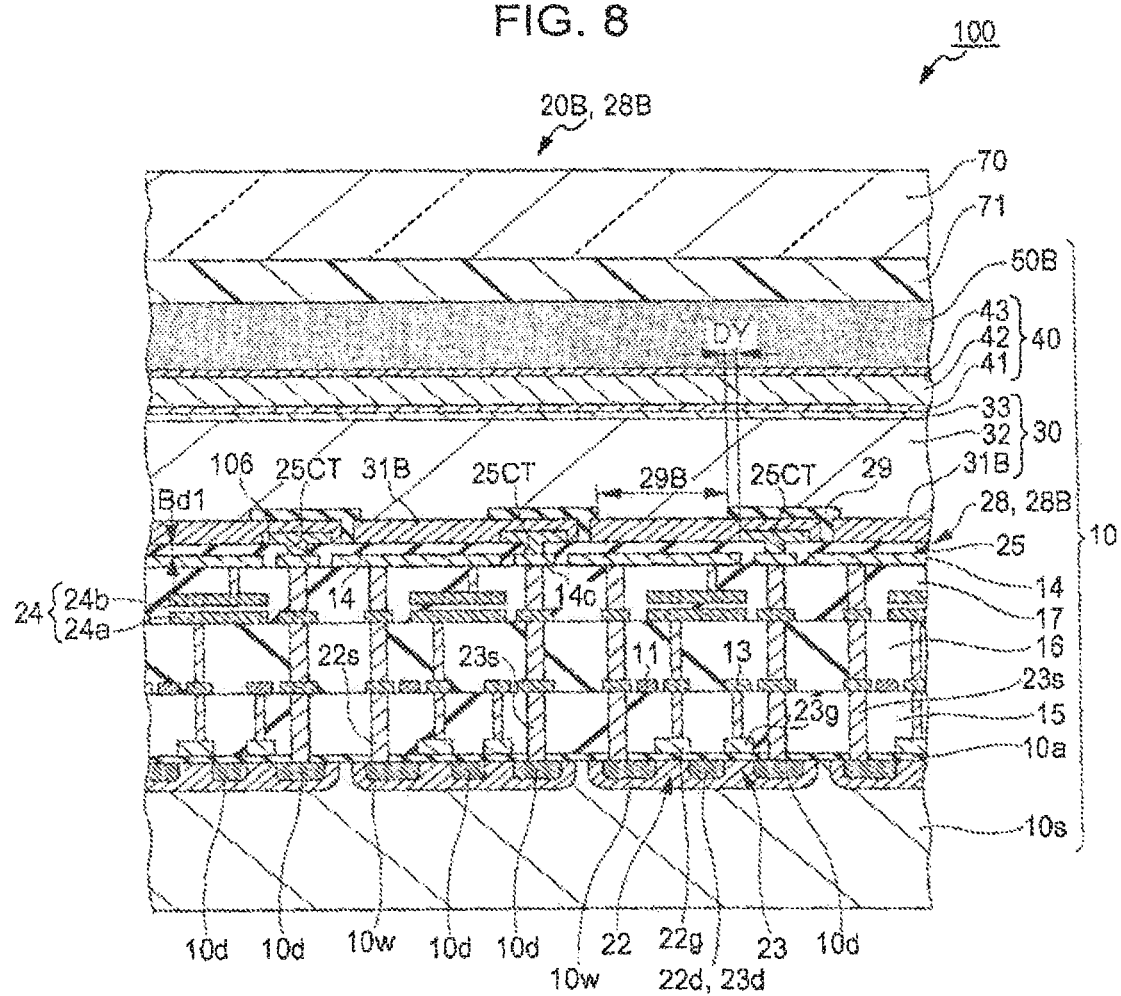
FIG. 8 is a schematic cross-sectional diagram taken along line VIII-VIII of FIG. 3.

FIG. 4 is a schematic cross-sectional diagram taken along line IV-IV of FIG. 3. That is, FIG. 4 is a schematic cross-sectional diagram illustrating an area, in which openings are provided, in the second insulation layer which defines the light emission area. FIG. 5 is a schematic cross-sectional diagram taken along line V-V of FIG. 3. That is, FIG. 5 is a schematic cross-sectional diagram illustrating an area in which the pixel electrode is electrically connected to the third transistor. FIG. 6 is a schematic cross-sectional diagram taken along line VI-VI of FIG. 3. That is, FIG. 6 is a schematic cross-sectional diagram illustrating the light emitting pixel in which the red color (R) light emission is acquired. FIG. 7 is a schematic cross-sectional diagram taken along line VII-VII of FIG. 3. That is, FIG. 7 is a schematic cross-sectional diagram illustrating the light emitting pixel in which the green color (G) light emission is acquired. FIG. 8 is a schematic cross-sectional diagram taken along line VIII-VIII of FIG. 3. That is, FIG. 8 is a schematic cross-sectional diagram illustrating the light emitting pixel in which the blue color (B) light emission is acquired.

Meanwhile, FIG. 4 illustrates the first transistor 21, the second transistor 22, wirings, which are related to the first transistor 21 and the second transistor 22, and the like of the pixel circuit, and does not illustrate the third transistor 23. FIG. 5 illustrates the third transistor 23, wirings, which are related to the third transistor 23, and the like of the pixel circuit and does not illustrate the first transistor 21 and the second transistor 22. In FIGS. 6 to 8, the second transistor 22, the third transistor 23, the wirings, which are related to the second transistor 22 and the third transistor 23, and the like are illustrated but the first transistor 21 is not illustrated.

First, a cross-sectional structure of the area, in which the openings 29B, 29G, and 29R are provided, in the second insulation layer 29 which defines the light emission area, will be described with reference to FIG. 4.

As shown in FIG. 4, the organic EL apparatus 100 includes the element substrate 10, a sealing substrate 70, and a resin layer 71 which is interposed between the element substrate 10 and the sealing substrate 70.

The sealing substrate 70 is a translucent insulation substrate, and a quartz substrate, a glass substrate, or the like can be used as the sealing substrate 70. The sealing substrate 70 has a function to protect the organic EL elements 30 which are arranged in the display area E from being damaged, and is widely provided instead of the display area E. The resin layer 71 has a function to cause the element substrate 10 to adhere to the sealing substrate 70, and, for example, an epoxy resin, an acrylic resin, or the like can be used as the resin layer 71.

The element substrate 10 includes the pixel circuit (the first transistor 21, the second transistor 22, the third transistor 23, the storage capacitor 24, and the organic EL element 30), a sealing layer 40, a color filter 50, and the like.

Light, which is emitted from the light emitting pixel 20, passes through the color filter 50 and is emitted from a side of the sealing substrate 70. That is, the organic EL apparatus 100 includes a top emission structure. Since the organic EL apparatus 100 includes the top emission structure, an opaque ceramic substrate or a semiconductor substrate can be used as a base material 10s of the element substrate 10 in addition to the transparent quartz substrate and the glass substrate. In the embodiment, a semiconductor substrate, for example, a silicon substrate is used as the base material 10s.

The base material 10s is provided with well sections 10w, which are formed by injecting ions into the semiconductor substrate, and ion injection sections 10d that are active layers which are formed by injecting ions, having different types from the well sections 10w, to the well sections 10w. The well sections 10w function as channels of the transistors 21, 22, and 23 in the light emitting pixel 20. The ion injection sections 10d function as the parts of the sources, the drains, and the wirings of the transistors 21, 22, and 23 in the light emitting pixel 20.

An insulation film 10a is provided to cover a surface of the base material 10s in which the ion injection sections 10d and the well sections 10w are formed. The insulation film 10a functions as a gate insulation film of each of the transistors 21, 22, and 23. A gate electrode 22g which is formed of, for example, a conductive film, such as polysilicon, is formed on the insulation film 10a. The gate electrode 22g is arranged to face the well section 10w which functions as the channel of the second transistor 22. The gate electrode is formed in the same manner with regard to the first transistor 21 and the third transistor 23.

A first interlayer insulation film 15 is provided to cover the gate electrode 22g. In the first interlayer insulation film 15, for example, contact holes, which reach the drain of the first transistor 21 and the gate electrode 22g of the second transistor 22, are provided. A conductive film, which coats at least the insides of the contact holes and covers a surface of the first interlayer insulation film 15, is formed. When the conductive film is patterned, wiring, which connects, for example, a drain electrode 21d of the first transistor 21 to the gate electrode 22g of the second transistor 22, is provided.

Subsequently, a second interlayer insulation film 16 is provided to cover the first interlayer insulation film 15 and the wirings on the first interlayer insulation film 15. In the second interlayer insulation film 16, contact holes, which reach the wirings provided on the first interlayer insulation film 15, are provided. A conductive film, which coats at least the insides of the contact holes and covers a surface of the second interlayer insulation film 16, is formed. When the conductive film is patterned, for example, a contact section, which electrically connects one side electrode 24a of the storage capacitor 24 to the gate electrode 22g of the second transistor 22, is provided. In addition, the data line 12 is provided in the same layer as the one side electrode 24a of the storage capacitor 24. The data line 12 is connected to a source of the first transistor 21 through the relay electrode (wiring) which is not shown in FIG. 4.

Although not shown in the drawing, a dielectric layer, which covers at least the one side electrode 24a of the storage capacitor 24, is provided. In addition, the other side electrode 24b of the storage capacitor 24 is provided to face the one side electrode 24a of the storage capacitor 24 while interposing the dielectric layer therebetween. Therefore, the storage capacitor 24 is formed by the pair of electrodes 24a and 24b and the dielectric layer.

A third interlayer insulation film 17 is provided to cover the storage capacitor 24. In the third interlayer insulation film 17, for example, the other side electrode 24b of the storage capacitor 24 and contact holes, which reach wirings formed on the second interlayer insulation film 16, are provided. A conductive film, which coats at least the insides of the contact holes and covers a surface of the third interlayer insulation film 17, is formed. When the conductive film is patterned, a power line 14, a relay electrode 14c (refer to FIG. 5), and the like are provided. In the embodiment, the power line 14 and the relay electrode 14c are formed of a conductive material which includes both light reflexivity and conductivity, for example, aluminum, aluminum alloy, or the like. The film thickness of the power line 14 and the relay electrode 14c is approximately 100 nm.

The power line 14 is provided on approximately the whole surface of the display area E, and includes openings for the respective light emitting pixels 20B, 20G, and 20R. Relay electrodes 14c are provided in the openings of the power line 14. The power line 14 is arranged on the upper side of the transistors 21, 22, and 23 to face the pixel electrode 31. Light which is emitted from the light emission area (openings 29B, 29G, and 29R) is reflected in the power line 14.

The power line 14 is an example of a "light reflection layer" in the invention.

Meanwhile, the light reflection layer which reflects light emitted from the light emission area (openings 29B, 29G, and 29R) may be configured to be provided in an island shape for each pixel electrode 31.

A first insulation film 25, a second insulation film 26, and a third insulation film 27 are sequentially laminated onto the power line 14. The first insulation film 25, the second insulation film 26, and the third insulation film 27 are formed of an insulation material which has the optical transparency. In the embodiment, the first insulation film 25 is formed of silicon nitride, and the second insulation film 26 and the third insulation film 27 are formed of silicon oxide. The film thickness of the first insulation film 25 is approximately 50 nm. The film thickness of the second insulation film 26 and the third insulation film 27 is approximately 60 nm to 70 nm.

The first insulation film 25 is provided for the light emitting pixel 20B in which blue color (B) light emission is acquired, the light emitting pixel 20G in which green color (G) light emission is acquired, and the light emitting pixel 20R in which red color (R) light emission is acquired. The second insulation film 26 is provided for the light emitting pixel 20G in which green color (G) light emission is acquired and the light emitting pixel 20R in which red color (R) light emission is acquired. The third insulation film 27 is provided for the light emitting pixel 20R in which red color (R) light emission is acquired.

The first insulation layer 28 includes the first insulation film 25, the second insulation film 26, and the third insulation film 27.

More specifically, the first insulation layer 28 of the light emitting pixel 20B in which blue color (B) light emission is acquired includes the first insulation film 25 and has a film thickness Bd1. Further, in the light emitting pixel 20B, the first insulation layer 28, which has the film thickness Bd1, is provided to reach the contact area from the opening 29B (light emission area) except the contact area in which the relay electrode 106B is connected to the pixel electrode 31B. In addition, the first insulation layer 28, which has the film thickness Bd1, is provided over the plurality of light emitting pixels 20B which are arranged in the Y direction. In addition, in other words, a plurality of openings 29B (light emission area), which are arranged in the Y direction, are provided in the first area 28B. In addition, a contact area, which connects the relay electrode 106B to the pixel electrode 31B, is provided in the first area 28B. As shown in FIG. 5, in the contact area, the pixel electrode 31B is directly connected to the relay electrode 106B.

The first insulation layer 28 of the light emitting pixel 20G, in which green color (G) light emission is acquired, includes the first insulation film 25 and the second insulation film 26, and has a film thickness Gd1. Further, in the light emitting pixel 20G, the first insulation layer 28 which has the film thickness Gd1 is provided to reach the contact area from the opening 29G (light emission area) except the contact area in which the relay electrode 106G is connected to the pixel electrode 31G. The first insulation layer 28, which has the film thickness Gd1, is provided over the plurality of light emitting pixels 20G which are arranged in the Y direction. In addition, in other words, a plurality of openings 29G (light emission area), which are arranged in the Y direction, are provided in the second area 28G. In addition, a contact area, in which the relay electrode 106G is connected to the pixel electrode 31G, is provided in the second area 28G. As shown in FIG. 5, the pixel electrode 31G is connected to the relay electrode 106G through a contact hole 28CT1 in the contact area.

The first insulation layer 28 of the light emitting pixel 20R, in which red color (R) light emission is acquired, includes the first insulation film 25, the second insulation film 26, and the third insulation film 27, and has a film thickness Rd1. Further, in the light emitting pixel 20R, the first insulation layer 28, which has the film thickness Rd1, is provided to reach the contact area from the opening 29R (light emission area) except the contact area in which the relay electrode 106R is connected to the pixel electrode 31R. The first insulation layer 28, which has the film thickness Rd1, is provided over the plurality of light emitting pixels 20R which are arranged in the Y direction. In addition, in other words, in the third area 28R, the plurality of openings 29R (light emission area) which are arranged in the Y direction are arranged. A contact area, in which the relay electrode 106R is connected to the pixel electrode 31R, is provided in the third area 28R. As shown in FIG. 5, the pixel electrode 31R is connected to the relay electrode 106R through a contact hole 28CT2 in the contact area.

Therefore, thickness becomes larger in the order of the first insulation layer 28 (film thickness Bd1) of the light emitting pixel 20B, the first insulation layer 28 (film thickness Gd1) of the light emitting pixel 20G, and the first insulation layer 28 (film thickness Rd1) of the light emitting pixel 20R.

In other words, the first insulation layer 28 which includes the first insulation film 25, that is, the first insulation layer 28 in the area in which the light emitting pixel 20B is arranged corresponds to the first area 28B. The first insulation layer 28 which includes the first insulation film 25 and the second insulation film 26, that is, the first insulation layer 28 in the area in which the light emitting pixel 20G is arranged corresponds to the second area 28G. The first insulation layer 28 which includes the first insulation film 25, the second insulation film 26, and the third insulation film 27, that is, the first insulation layer 28 in the area in which the light emitting pixel 20R is arranged corresponds to the third area 28R.

Meanwhile, the film thickness Bd1 is an example of a "first layer thickness" in the invention. The film thickness Gd1 is an example of a "second layer thickness" in the invention. The film thickness Rd1 is an example of a "third layer thickness" in the invention.

The pixel electrode 31 is provided in an island shape on the first insulation layer 28, and faces the power line 14 while interposing the first insulation layer 28 therebetween. More specifically, the pixel electrode 31B is provided in an island shape on the first insulation layer 28 which has the film thickness Bd1, the pixel electrode 31G is provided in an island shape on the first insulation layer 28 which has the film thickness Gd1, and the pixel electrode 31R is provided in an island shape on the first insulation layer 28 which has the film thickness Rd1. The pixel electrode 31 is an electrode which has optical transparency, which is formed of, for example, an optically transparent material, such as Indium Tin Oxide (ITO), and which supplies holes in the light emission functional layer 32. The film thickness of the pixel electrode 31 is approximately 100 nm.

The second insulation layer 29 is provided to cover the peripheral section of the pixel electrode 31. The second insulation layer 29 is formed of, for example, silicon oxide, and insulates each of the pixel electrodes 31R, 31G, and 31B. The film thickness of the second insulation layer 29 is approximately 60 nm. The openings 29B, 29G, and 29R are provided in the second insulation layer 29. The area in which the openings 29B, 29G, and 29R are provided is the light emission area of the light emitting pixel 20. Meanwhile, the second insulation layer 29 may be formed using an organic material, for example, an acrylic photosensitive resin.

The light emission functional layer 32, the facing electrode 33, and the sealing layer 40 are sequentially laminated to cover the pixel electrode 31 and the second insulation layer 29.

The light emission functional layer 32 includes a hole injection layer, a hole transport layer, an organic light emitting layer, an electron transport layer, and the like which are sequentially laminated from a side of the pixel electrode 31. Holes which are supplied from the pixel electrode 31 are coupled to electrons which are supplied from the facing electrode 33 in the organic light emitting layer, and the light emission functional layer 32 emits light. A film thickness of the light emission functional layer 32 is approximately 110 nm.

The organic light emitting layer emits light which has light components of a red color, a green color, and a blue color. The organic light emitting layer may include a single layer or may include a plurality of layers (for example, a blue color light emitting layer which mainly emits light with blue color when current flows, and a yellow color light emitting layer which emits light having red color and green color when current flows).

The facing electrode 33 is a common electrode which supplies electrons to the light emission functional layer 32. The facing electrode 33 is provided to cover the light emission functional layer 32, is formed of, for example, an alloy of Mg and Ag, and the like, and has optical transparency and light reflexivity. A film thickness of the facing electrode 33 is approximately 10 nm to 30 nm. When the material (the alloy of Mg and Ag, and the like) which forms the facing electrode 33 is thinned, it is possible to realize a function of optical transparency in addition to a function of light reflexivity.

The sealing layer 40 is arranged on the facing electrode 33. The sealing layer 40 is a passivation film which suppresses the deterioration of the light emission functional layer 32 and the facing electrode 33, and suppresses the invasion of moisture or oxygen onto the light emission functional layer 32 and the facing electrode 33. Sealing layer 40 includes a first sealing layer 41, a buffer layer 42, and a second sealing layer 43 which are sequentially laminated from a side of the facing electrode 33, cover the organic EL element 30 (display area E), and are provided on approximately the whole surface of the element substrate 10. Meanwhile, in the sealing layer 40, openings (not shown in the drawing) for exposing the external connection terminals 103 (refer to FIG. 1) are provided.

The first sealing layer 41 is formed of silicon oxynitride which is formed using, for example, a plasma Chemical Vapor Deposition (CVD) method in the well-known technique, and has a high barrier property with regard to moisture and oxygen. A film thickness of the first sealing layer 41 is approximately 200 nm to 400 nm. In addition to the above-described silicon oxynitride, metallic oxide, such as silicon oxide, silicon nitride, titanium oxide, can be used as a material to form the first sealing layer 41.

The buffer layer 42 is formed of, for example, an epoxy-based resin, a coating-type inorganic material (silicon oxide or the like), or the like which is excellent in thermal stability. A film thickness of the buffer layer 42 is thicker than the film thickness of the first sealing layer 41, that is, approximately 1000 nm to 5000 nm. The buffer layer 42 coats the defects of the first sealing layer 41 (pin holes or cracks), foreign substances, and the like, and a surface of the side of the second sealing layer 43 in the buffer layer 42 is formed with a plane surface compared to a surface of the side of the facing electrode 33.

The second sealing layer 43 is formed of silicon oxynitride which is formed using, for example, a plasma CVD method according to the well-known technique. A film thickness of the second sealing layer 43 is approximately 300 nm to 700 nm. The second sealing layer 43 is formed of the same material as the first sealing layer 41, and has a high barrier property with regard to moisture or oxygen.

Coloration layers 50B, 50G, and 50R corresponding to the light emitting pixels 20B, 20G, and 20R are provided on the sealing layer 40. In other words, a color filter 50, which includes the coloration layers 50B, 50G, and 50R, is formed on the sealing layer 40. Here, the color filter 50 is provided while being laminated onto the sealing layer 40.

Subsequently, a cross-sectional structure of a portion (contact section) in which the pixel electrode 31 is electrically connected to the third transistor 23 will be described with reference to FIG. 5.

As shown in FIG. 5, the ion injection section 10d, which functions as the source of the third transistor 23 is provided in the base material 10s. The ion injection section 10d (base material 10s) is covered by the insulation film 10a and the first interlayer insulation film 15. In the first interlayer insulation film 15 and the insulation film 10a, the contact hole which reaches the ion injection section 10d of the third transistor 23 is provided. A conductive film, which coats at least the inside of the contact hole and covers a surface of the first interlayer insulation film 15, is formed. When the conductive film is patterned, the source electrode 23s of the third transistor 23 and wiring which is connected to the source electrode 23s are provided.

The wiring which is connected to the first interlayer insulation film 15 and the source electrode 23s is covered by the second interlayer insulation film 16. In the second interlayer insulation film 16, a contact hole which reaches the wiring connected to the source electrode 23s is provided. A conductive film, which coats at least the inside of the contact hole and covers a surface of the second interlayer insulation film 16, is formed. When the conductive film is patterned, wiring is provided on the second interlayer insulation film 16. The second interlayer insulation film 16 is covered by the third interlayer insulation film 17. In the third interlayer insulation film 17, a contact hole, which reaches the wiring provided on the second interlayer insulation film 16, is provided. A conductive film, which coats at least the inside of the contact hole and covers a surface of the third interlayer insulation film 17, is formed. When the conductive film is patterned, the power line 14 and the relay electrode 14c are provided on the third interlayer insulation film 17.

As described above, the power line 14 is provided on approximately the whole surface of the display area E, and includes openings for each of the light emitting pixels 20B, 20G, and 20R. The relay electrode 14c is provided in an island shape in the opening of the power line 14 with regard to each of the light emitting pixels 20B, 20G, and 20R. In addition, the relay electrode 14c forms a part of the wiring which electrically connects the pixel electrode 31 to the third transistor 23.

The first insulation film 25 is provided to cover the power line 14 and the relay electrode 14c. In the first insulation film 25, a contact hole 61CT, which exposes a part of the relay electrode 14c, is provided. A conductive film, which coats at least the inside of the contact hole 61CT and covers a surface of the first insulation film 25, is formed. When the conductive film is patterned, the relay electrode 106 is provided on the first insulation film 25. The relay electrode 106 is connected to the relay electrode 14c through the contact hole 61CT. The relay electrode 106 forms a part of the wiring which electrically connects the pixel electrode 31 to the third transistor 23.

The relay electrode 106 is formed of a light shading conductive material, for example, titan nitride. The film thickness of the relay electrode 106 is approximately 50 nm. The relay electrode 106 is provided in an island shape in each of the light emitting pixels 20B, 20G, and 20R to cover the opening of the power line 14 in a plane view. In other words, the relay electrode 106 is provided to prevent light, which is emitted from the light emission functional layer 32, from passing through the opening of the power line 14 and from being incident to each of the transistors 21, 22, and 23. That is, the relay electrode 106 has a function to interrupt incident light emitted from the light emission functional layer 32 and to suppress the transistors 21, 22, and 23 from malfunctioning.

The pixel electrode 31 is provided to be superimposed on the relay electrode 106 in the plane view. As described above, the relay electrode 106B and the pixel electrode 31B are provided in the light emitting pixel 20B, the relay electrode 106G and the pixel electrode 31G are provided in the light emitting pixel 20G, and the relay electrode 106R and the pixel electrode 31R are provided in the light emitting pixel 20R.

In the light emitting pixel 20B, the pixel electrode 31B is directly connected to the relay electrode 106B.

In the light emitting pixel 20G, the second insulation film 26 is provided between the relay electrode 106G and the pixel electrode 31G. The contact hole 28CT1, which exposes a part of the relay electrode 106G, is provided in the second insulation film 26. The pixel electrode 31B is connected to the relay electrode 106G through the contact hole 28CT1.

In the light emitting pixel 20R, the second insulation film 26 and the third insulation film 27 are sequentially provided (laminated) from a side of the relay electrode 106R between the relay electrode 106R and the pixel electrode 31R. In the second insulation film 26 and the third insulation film 27, the contact hole 28CT2, which exposes a part of the relay electrode 106R, is provided. The pixel electrode 31R is connected to the relay electrode 106R through the contact hole 28CT2.

Meanwhile, the contact hole 28CT1 is an example of a "first contact hole" in the invention. The contact hole 28CT2 is an example of a "second contact hole" in the invention.

In this manner, the insulation film, which is arranged between the relay electrode 14c and the relay electrode 106, is common (first insulation film 25) to each of the light emitting pixels 20B, 20G, and 20R. Further, the film thickness of the first insulation layer 28, which is provided between the power line 14 and the pixel electrode 31, differs in each of the light emitting pixels 20B, 20G, and 20R. More specifically, in the light emitting pixel 20B, the first insulation layer 28, which includes the first insulation film 25 and which has the film thickness Bd1, is arranged between the power line 14 and the pixel electrode 31. In the light emitting pixel 20G, the first insulation layer 28, which includes the first insulation film 25 and the second insulation film 26 and which has the film thickness Gd1, is arranged between the power line 14 and the pixel electrode 31. In the light emitting pixel 20R, the first insulation layer 28, which includes the first insulation film 25, the second insulation film 26, and the third insulation film 27 and which has the film thickness Rd1, is arranged between the power line 14 and the pixel electrode 31.

Here, in the embodiment, the first insulation film 25 is formed of silicon nitride, and the second insulation film 26 and the third insulation film 27 are formed of silicon oxide. Further, the insulation film, which is arranged between the relay electrode 14c and the relay electrode 106, is formed of silicon nitride. Therefore, when the second insulation film 26 and the third insulation film 27, which are formed of silicon oxide, are processed, it is possible to improve a processing accuracy for enabling an etching selection ratio with regard to the first insulation film 25 to be acquired, and it is possible to securely connect the relay electrode 14c to the pixel electrode 31.

In the first area 28B, the pixel electrode 31B is provided on the first insulation layer 28 (first insulation film 25) which has the film thickness Bd1, and the pixel electrode 31B is directly connected to the relay electrode 106B. In the second area 28G, the pixel electrode 31G is provided on the first insulation layer 28 (the first insulation film 25 and the second insulation film 26) which has the film thickness Gd1, the pixel electrode 31G is connected to the relay electrode 106G through the contact hole 28CT1. In the third area 28R, the pixel electrode 31R is provided on the first insulation layer 28 (the first insulation film 25, the second insulation film 26, and the third insulation film 27) which has the film thickness Rd1, and the pixel electrode 31R is connected to the relay electrode 106R through the contact hole 28CT2.

The pixel electrode 31B which is provided in the first area 28B, the pixel electrode 31G which is provided in the second area 28G, and the pixel electrode 31R which is provided in the third area 28R are covered by the second insulation layer 29. Further, the light emission functional layer 32, the facing electrode 33, the sealing layer 40, and the color filter 50 are sequentially provided (laminated) on the second insulation layer 29.

Subsequently, a cross-sectional structure of the light emitting pixel 20 in the Y direction will be described with reference to FIGS. 6 to 8.

As shown in FIGS. 6 to 8, in the base material 10s, the well section 10w, which is shared by the second transistor 22 and the third transistor 23, is provided. In the well section 10w, three ion injection sections 10d are provided. An ion injection section 10d, which is positioned at the center of the three ion injection sections 10d, functions as the drain 22d (23d) which is shared by the second transistor 22 and the third transistor 23. An insulation film 10a is provided to cover the well section 10w. Further, the gate electrodes 22g and 23g (the gate electrode 22g of the second transistor 22 and the gate electrode 23g of the third transistor 23), which are formed of, for example, a conductive film, such as polysilicon, are provided on the insulation film 10a. Each of the gate electrodes 22g and 23g is arranged to face a part which functions as a channel in the well section 10w between a central side ion injection section 10d and a terminal side ion injection section 10d.

Subsequently, the gate electrode 22g of the second transistor 22 is connected to the one-side electrode 24a of the storage capacitor 24, which is provided on the second interlayer insulation film 16, through the contact hole which passes through the first interlayer insulation film 15 and the second interlayer insulation film 16. The source electrode 22s of the second transistor 22 is connected to the power line 14, which is provided on the third interlayer insulation film 17, through the contact hole which passes through the first interlayer insulation film 15, the second interlayer insulation film 16, and the third interlayer insulation film 17.

The gate electrode 23g of the third transistor 23 is connected to the lighting control line 13, which is provided on the first interlayer insulation film 15, through the contact hole which passes through the first interlayer insulation film 15. In addition to the lighting control line 13, the scan line 11 is provided on the first interlayer insulation film 15. The scan line 11 is connected to the gate of the first transistor 21 through a contact hole which is not shown in FIG. 5.

The source electrode 23s of the third transistor 23 is connected to the relay electrode 14c, which is provided on the third interlayer insulation film 17, through a contact hole which passes through the first interlayer insulation film 15, the second interlayer insulation film 16, and the third interlayer insulation film 17. The relay electrode 14c is covered by the first insulation film 25, and is connected to the relay electrode 106, which is provided on the first insulation film 25, through a contact hole 25CT.

In the light emitting pixel 20R, the pixel electrode 31R is connected to the relay electrode 106R through the contact hole 28CT2 which is provided in the second insulation film 26 and the third insulation film 27.

As shown in FIG. 6, the second insulation film 26 and the third insulation film 27 are provided in the light emitting pixel 20R except the contact area in which the pixel electrode 31R is connected to the relay electrode 106R through the contact hole 28CT2. The first insulation film 25 is provided in the light emitting pixel 20R except the contact area in which the relay electrode 106R is connected to the relay electrode 14c through the contact hole 25CT. The contact hole 28CT2, the relay electrode 106R, and the contact hole 25CT are examples of a "third connection part" in the invention. The third connection part is provided in the third area 28R (third layer thickness part). The third connection part is surrounded by the first insulation film 25, the second insulation film 26, and the third insulation film 27. Further, in the third area 28R (the third layer thickness part), the opening 29R (the light emission area) is arranged in the Y direction. In addition, the first insulation film 25, the second insulation film 26, and the third insulation film 27 are provided to be buried between the third connection parts. Therefore, there is not a step due to the first insulation layer 28 between the opening 29R (light emission area) and the contact area. Compared to a case where there is a step, it is possible to cause a distance DY between the light emission area (opening 29R) and the contact area (relay electrode 106G) to be small. In other words, it is possible to cause the opening 29R (light emission area) to be close to the contact area on the right side of FIG. 6. Further, it is possible to cause the opening 29R (light emission area) to be close to the contact area on the left side of FIG. 6. Therefore, it is possible to cause the opening 29R (light emission area) to be large.

In the light emitting pixel 20G, pixel electrode 31G is connected to the relay electrode 106G through the contact hole 28CT1 which is provided in the second insulation film 26.

As shown in FIG. 7, the second insulation film 26 is provided in the light emitting pixel 20G except a contact area in which the pixel electrode 31G is connected to the relay electrode 106G through the contact hole 28CT1. In addition, the first insulation film 25 is provided in the light emitting pixel 20G other than an area in which the relay electrode 106G is connected to the relay electrode 14c through the contact hole 25CT. The contact hole 28CT1, the relay electrode 106G, and the contact hole 25CT are examples of a "second connection part" and a "fourth connection part" in the invention. The second connection part and the fourth connection part are provided in the second area 28G (second layer thickness part). The second connection part and the fourth connection part are surrounded by the first insulation film 25 and the second insulation film 26. Further, in the second area 28G (second layer thickness part), the openings 29G (light emission area) are arranged in the Y direction. In addition, the first insulation film 25 and the second insulation film 26 are provided to be buried between the second connection part and the fourth connection part. Therefore, there is not a step due to the first insulation layer 28 between the openings 29G (light emission area) and the contact area. Compared to a case where there is a step, it is possible to cause a distance DY between the light emission area (openings 29G) and the contact area (relay electrode 106G) to be small. In other words, it is possible to cause the openings 29G (light emission area) to be close to the contact area on the right side of FIG. 7. Further, it is possible to cause the openings 29G (light emission area) to be close to the contact area on the left side of FIG. 7. Therefore, it is possible to cause the openings 29G (light emission area) to be large.

In the light emitting pixel 20B, the pixel electrode 31B is directly connected to the relay electrode 106B.

As shown in FIG. 8, the first insulation film 25 is provided except a contact area in which the relay electrode 106B is connected to the relay electrode 14c through the contact hole 25CT. The contact hole 25CT and the relay electrode 106B are examples of a "first connection part" in the invention. The first connection part is provided in the first area (first layer thickness part). The second connection part is surrounded by the first insulation film 25 and the second insulation film 26. Further, in the first area (first layer thickness part), the opening 29B (light emission area) is arranged in the Y direction. In addition, the first insulation film 25 is provided to be buried between the first connection parts. Therefore, there is not a step due to the first insulation layer 28 between the opening 29B (light emission area) and the contact area. Compared to a case where there is a step, it is possible to cause a distance DY between the light emission area (opening 29B) and the contact area (relay electrode 106G) to be small. In other words, it is possible to cause the opening 29B (light emission area) to be close to the contact area on the right side of FIG. 8. Further, it is possible to cause the opening 29R (light emission area) to be close to the contact area on the left side of FIG. 8. Therefore, it is possible to cause the opening 29B (light emission area) to be large.

The second insulation layer 29, the light emission functional layer 32, the facing electrode 33, the sealing layer 40, and the color filter 50 are sequentially laminated onto the pixel electrode 31.

Optical Resonance Structure

In the light emission area (openings 29B, 29G, and 29R), the power line 14 which has light reflexivity, the first insulation layer 28, the pixel electrode 31, the light emission functional layer 32, and the facing electrode 33 which has light reflexivity and optical transparency are laminated. According to the configuration, light, which is emitted from the light emission functional layer 32, is caused to reciprocate (to be reflected) between the power line 14 and the facing electrode 33, and thus light, which has a specific wavelength, is resonated. Therefore, light, which has the specific wavelength, is strengthened compared to an area which has another wavelength, and light emitted from the organic EL element 30. Further, light, which has the specific wavelength, is emitted as display light in a direction from the power line 14 forward the facing electrode 33, that is, from the sealing substrate 70. In this manner, the organic EL apparatus 100 has the optical resonance structure which includes the power line 14, the first insulation layer 28, the pixel electrode 31, the light emission functional layer 32, and the facing electrode 33, and is configured to enhance the color purity of light which is emitted from the light emitting pixel 20 by selectively strengthening light, which has the specific wavelength.

Hereinafter, the outline of the optical resonance structure will be described.

The first insulation layer 28 has a function to adjust an optical pass length (optical distance) between the power line 14 and the facing electrode 33, and the resonant wavelength varies according to the film thickness of the first insulation layer 28. More specifically, when it is assumed that an optical distance from the power line 14 to the facing electrode 33 is D, a phase shift in reflection in the reflection layer is φL, a phase shift in reflection in the facing electrode 33 is φU, a peak wavelength of a standing wave is λ, and an integer number is m, the optical distance D satisfies the following equation (1).

$$D = \{(2\pi m + \varphi L + \varphi U)/4\pi\}\lambda \quad (1)$$

The optical distance D in the optical resonance structure of the light emitting pixels 20B, 20G, and 20R becomes larger in the order of B, G, and R, and the optical distance D is adjusted by varying the film thickness of the first insulation layer 28 which is arranged between the power line 14 and the pixel electrode 31.

As shown in FIG. 6, in the light emitting pixel 20R, the first insulation layer 28, which is arranged between the power line 14 and the pixel electrode 31R, includes the first insulation film 25, the second insulation film 26, and the third insulation film 27, and has a film thickness Rd1. As shown in FIG. 7, in the light emitting pixel 20G, the first insulation layer 28, which is arranged between the power line 14 and the pixel electrode 31G, includes the first insulation film 25 and the second insulation film 26, and has a film thickness Gd1. As shown in FIG. 8, in the light emitting pixel 20B, the first insulation layer 28, which is arranged between the power line 14 and the pixel electrode 31B, includes the first insulation film 25, and has a film thickness Bd1. Therefore, the film thickness of the first insulation layer 28 becomes larger in the order of light emitting pixel 20B (film thickness Bd1)<light emitting pixel 20G (film thickness Gd1)<light emitting pixel 20R (film thickness Rd1). Therefore, the optical distance D becomes larger in the order of light emitting pixel 20B<light emitting pixel 20G<light emitting pixel 20R.

More specifically, in the light emitting pixel 20R, the optical distance D is set such that the resonant wavelength (peak wavelength which has the highest brightness) is 610 nm. Similarly, in the light emitting pixel 20G, the optical distance D is set such that the resonant wavelength (peak wavelength which has the highest brightness) is 540 nm. In the light emitting pixel 20B, the optical distance D is set such that the resonant wavelength (peak wavelength which has the highest brightness) is 470 nm.

In order to realize the peak wavelength, if the film thickness of the first insulation layer 28 between the reflection layer and the facing electrode 33 is calculated when the film thickness of the pixel electrodes 31B, 31G, and 31R, which are formed of a transparent conductive film, such as ITO, is approximately 100 nm, the film thickness of the light emission functional layer 32 is approximately 110 nm and m=1 in Equation (1), the film thickness of the first insulation layer 28 is 170 nm in the light emitting pixel 20R, 115 nm in the light emitting pixel 20G, and 50 nm in the light emitting pixel 20B. That is, the film thickness of the first insulation layer 28Rd1 in the light emitting pixel 20R (third area 28R) is approximately 170 nm, the film thickness of the first insulation layer 28Gd1 in the light emitting pixel 20G (second area 28G) is approximately 115 nm, and the film thickness of the first insulation layer 28Bd1 in the light emitting pixel 20B (first area 28B) is approximately 50 nm. The film thickness of the first insulation film 25, the second insulation film 26, and the third insulation film 27 is adjusted such that the first insulation layer 28 is formed.

As a result, light of red color (R) which has a peak wavelength of 610 nm is emitted from the light emitting pixel 20R, light of green color (G) which has a peak wavelength of 540 nm is emitted from the light emitting pixel 20G, and light of blue color (B) which has a peak wavelength of 470 nm is emitted from the light emitting pixel 20B.

In this manner, in the organic EL apparatus 100 according to the invention, it is possible to enhance the color purity of light which is emitted from the light emitting pixel 20 and to provide a clear display using the above-described optical resonance structure.

As shown in FIG. 6, the area, in which the opening 29R is provided, is the light emission area and the area, in which the relay electrode 106R is provided, is the contact area in the light emitting pixel 20R. The pixel electrode 31R is provided over the light emission area and the contact area. Since the film thickness of the first insulation layer 28 in the area, in which the pixel electrode 31R is arranged, is Rd1, the optical distance D is also fixed. Therefore, even when the light emission area (opening 29R) is enlarged and the distance DY between the light emission area (opening 29R) and the contact area (relay electrode 106R) is shortened, the optical distance D in the light emission area is fixed, and light of red color (R) which has a peak wavelength of 610 nm is emitted. That is, it is possible to maintain the peak wavelength of light, which is emitted from the light emission area, and to enhance the intensity of light of red color (R).

As shown in FIG. 7, in the light emitting pixel 20G, the area, in which the openings 29G are provided, is the light emission area and the area, in which the relay electrode 106G is provided, is the contact area. The pixel electrode 31G is arranged over the light emission area and the contact area. Since the film thickness of the first insulation layer 28 is Gd1 in the area in which the pixel electrode 31G is arranged, the optical distance D is also fixed. Therefore, even when the light emission area (openings 29G) is enlarged and the distance DY between the light emission area (opening 29R) and the contact area (relay electrode 106G) is shortened, the optical distance D in the light emission area is fixed, and light of green color (G) which has a peak wavelength of 540 nm is emitted. That is, it is possible to maintain the peak wavelength of light, which is emitted from the light emission area, and to enhance the intensity of light of green color (G).

As shown in FIG. 8, in the light emitting pixel 20B, the area, in which the opening 29B is provided, is the light emission area and the area, in which the relay electrode 106B is provided, is the contact area. The pixel electrode 31B is arranged over the light emission area and the contact area. Since the film thickness of the first insulation layer 28 in the area, in which the pixel electrode 31B is arranged, is Bd1, the optical distance D is also fixed. Therefore, even when the light emission area (opening 29B) is enlarged and the distance DY between the light emission area (opening 29B) and the contact area (relay electrode 106B) is shortened, the optical distance D in the light emission area is fixed, and light of blue color (B) which has a peak wavelength of 470 nm is emitted. That is, it is possible to maintain the peak wavelength of light, which is emitted from the light emission area, and to enhance the intensity of light of blue color (B).

For example, in the well-known technique (JP-A-2009-134067), the optical distance of the light emission area is different from the optical distance of the contact area, thereby having a boundary of a different optical distance between the light emission area and the contact area. In contrast, if the light emission area is enlarged over the boundary, a part which has a different optical distance is generated in the light emission area, light of a different peak wavelength is emitted from the light emission area, and thus the color purity of light, which is emitted from the light emission area, is deteriorated. Therefore, in the well-known technique, it is difficult to enlarge the light emission area over the boundary.

In the embodiment, since the optical distance D between the light emission area and the contact area is fixed, it is possible to enlarge the light emission area and to enhance the intensity of light, which is emitted from the light emission area, compared to the well-known technique.

In this manner, in the organic EL apparatus 100 according to the embodiment, it is possible to provide a bright and clear display.

Meanwhile, as long as light emission in the light emission functional layer 32 is not adversely affected, it is possible to enlarge the light emission area (openings 29B, 29G, and 29R). For example, if light emission in the light emission functional layer 32 is not adversely affected, the light emission area (openings 29B, 29G, and 29R) may be enlarged to be superimposed on at least a part of the contact area (relay electrodes 106B, 106G, and 106R).

Method of Manufacturing Organic EL Apparatus

Figure 9:
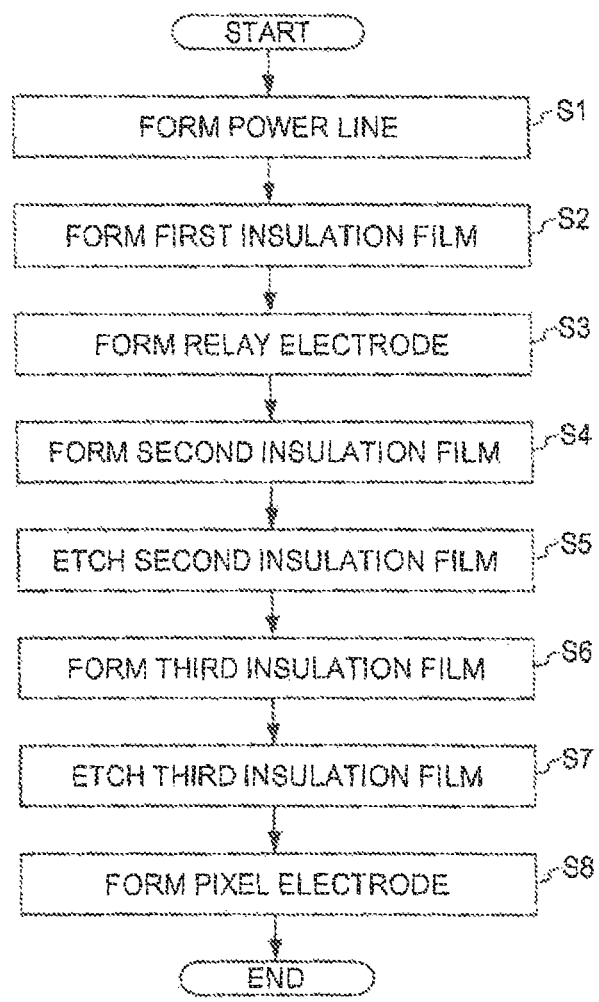
FIG. 9 is a process flowchart illustrating a method of manufacturing the organic EL apparatus.

Subsequently, a method of manufacturing the organic EL apparatus 100 will be described with reference to FIGS. 9 to 11D. FIG. 9 is a process flowchart illustrating the method of manufacturing the organic EL apparatus. FIGS. 10A to 10D and FIGS. 11A to 11D correspond to FIG. 5 and are schematic cross-sectional diagrams illustrating the states of the organic EL apparatus after each process shown in FIG. 9 is performed. Meanwhile, in FIGS. 10A to 10D and 11A to 11D, pixel circuits and wirings which are provided in the lower layer than the power line 14 in the element substrate 10 are not shown in the drawings.

As shown in FIG. 9, a process to manufacture the organic EL apparatus 100 includes a process to form the power line 14 as the light reflection layer (step S1), a process to form the first insulation film 25 (step S2), a process to form the relay electrode 106 (step S3), a process to form the second insulation film 26 (step S4), a process to etch the second insulation film 26 (step S5), a process to form the third insulation film 27 (step S6), a process to etch the third insulation film 27 (step S7), and a process to form the pixel electrode 31 (step S8).

Figure 10A:
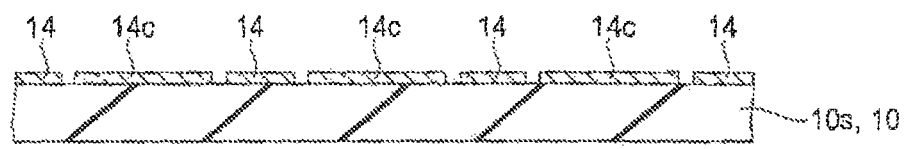
FIGS. 10A to 10D are schematic cross-sectional diagrams illustrating states of the organic EL apparatus after each process is performed.

In step S1, as shown in FIG. 10A, aluminum, an aluminum alloy, or the like is formed to have a film thickness of approximately 100 nm using, for example, a sputtering method, and the power line 14, which functions as the light reflection layer, and the relay electrode 14c are formed by patterning the aluminum, the aluminum alloy, or the like. As described above, the power line 14 is formed on approximately the whole surface of the display area E, and becomes a current supply source which causes the light emission functional layer 32 to emit light and the light reflection layer to reflect light emitted from the light emission functional layer 32. The power line 14 includes the opening in the light emitting pixel 20, and the relay electrode 14c is provided in the opening. That is, the power line 14 is provided over the plurality of light emitting pixels 20, and the relay electrode 14c is provided in an island shape in each of the plurality of light emitting pixels 20.

Figure 10B:
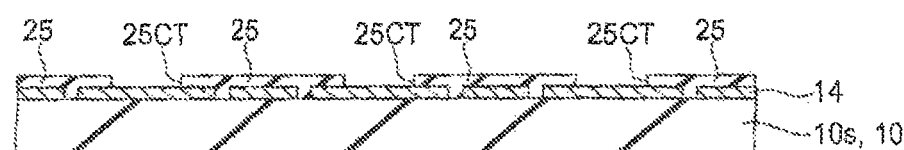

In step S2, as shown in FIG. 10B, silicon nitride is formed to have a film thickness of approximately 50 nm using, for example, a plasma CVD method. The first insulation film 25, which includes the contact hole 25CT for exposing a part of the relay electrode 14c, is formed by patterning the silicon nitride.

Figure 10C:
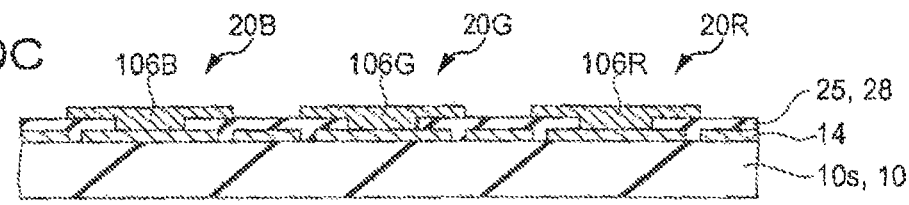

In step S3, titanium nitride is formed to have a film thickness of approximately 50 nm using, for example, the sputtering method, and the relay electrode 106 is formed by patterning the titanium nitride as shown in FIG. 10C. The relay electrode 106 is formed to cover the openings of the power line 14 in a planar view, and is connected to the relay electrode 14c through the contact hole 25CT.

Figure 10D:
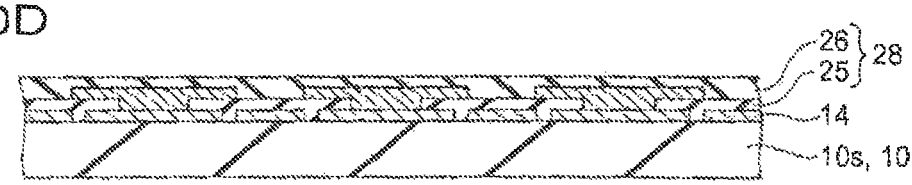

In step S4, silicon oxide is formed to have a film thickness of approximately 60 nm to 70 nm using, for example, the plasma CVD method, and the second insulation film 26, which covers the first insulation film 25 and the relay electrode 106, is formed as shown in FIG. 10D.

Figure 11A:
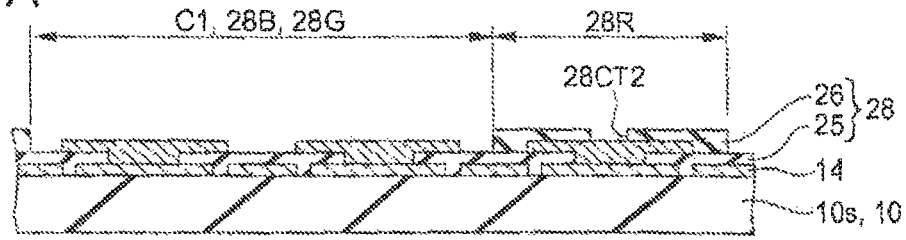
FIGS. 11A to 11D are schematic cross-sectional diagrams illustrating states of the organic EL apparatus after each process is performed.

Subsequently, in step S5, an opening C1 is formed by etching and removing a part of the second insulation film 26 using, for example, a dry etching method using fluorine containing gas, as shown in FIG. 11A. That is, the second insulation film 26 is not formed in the first area 28B and the second area 28G, which correspond to the opening C1, and the second insulation film 26 is provided in the third area 28R in which the opening C1 is not formed. Here, the contact hole 28CT2, which exposes a part of the relay electrode 106R of the third area 28R, is formed.

Here, since the first insulation film 25 is formed of silicon nitride and the second insulation film 26 is formed of silicon oxide, a selection ratio is present when etching is performed between the first insulation film 25 and the second insulation film 26. In the areas corresponding to the light emission area of the first area 28B and the second area 28G, the first insulation film 25 is exposed, and thus an etching speed becomes slow, and, ideally, etching stops. In addition, in the contact area of the third area 28R, the contact hole 28CT2 is formed and the surface of the relay electrode 106R is exposed, and thus the etching speed becomes slow, and, ideally, etching stops. In the same manner, in the contact areas with the first area 28B and the second area 28G, the surfaces of the relay electrode 106B and the relay electrode 106G are exposed and the first insulation film 25 is exposed in the periphery thereof, and thus the etching speed becomes slow, and, ideally, etching stops.

Figure 11B:
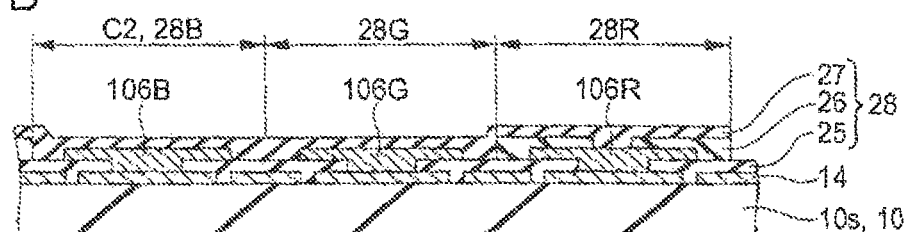

Subsequently, in step S6, silicon oxide is formed to have a film thickness of approximately 60 nm to 70 nm using, for example, the plasma CVD method, and the third insulation film 27 is formed as shown in FIG. 11B. Here, the third insulation film 27 is laminated onto the first insulation film 25 in the areas which correspond to the light emission areas of the first area 28B and the second area 28G, and is laminated onto the surfaces of the relay electrode 106B and the relay electrode 106G in the contact areas with the first area 28B and the second area 28G. In addition, the third insulation film 27 is laminated onto the second insulation film 26 in the area which corresponds to the light emission area of the third area 28R, and is laminated onto the relay electrode 106R and the second insulation film 26 in the contact area of the third area 28R. That is, the third insulation film 27 is formed in the contact hole 28CT2 which is provided in the second insulation film 26.

Figure 11C:
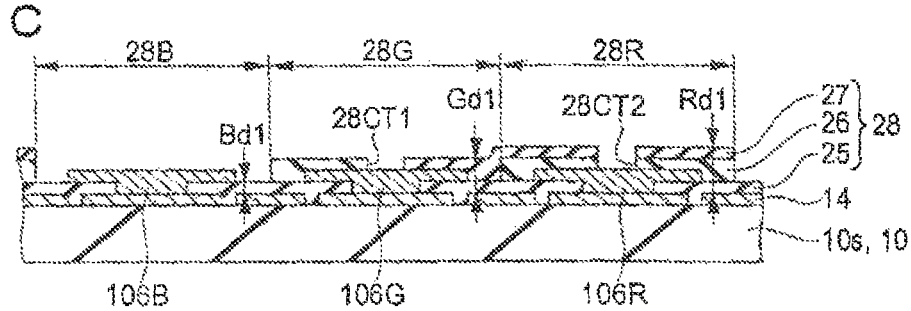

In step S7, an opening C2 is formed by etching and removing the silicon oxide (the third insulation film 27) in the opening C1 using, for example, the dry etching method using fluorine containing gas, as shown in FIG. 11C. That is, the opening C2 is provided in the third insulation film 27. In the first insulation layer 28 of the opening C2, the first insulation film 25 is laminated onto the power line 14, and the first insulation layer 28 has the film thickness Bd1. In the first insulation layer 28 of the opening C1 in a part in which the opening C2 is not formed, the first insulation film 25 and the second insulation film 26 are laminated onto the power line 14, and the first insulation layer 28 has the film thickness Gd1. Accordingly, the opening C2 becomes the first area 28B. In addition, in the opening C1 in a part in which the opening C2 is not formed, the first insulation film 25 and the second insulation film 26 are laminated onto the power line 14, and the first insulation film 25 and the second insulation film 26 have the film thickness Gd1. Accordingly, the opening C1 in a part in which the opening C2 is not formed becomes the second area 28G. In the first insulation layer 28 of the area in which the opening C1 is not formed, the first insulation film 25, the second insulation film 26, and the third insulation film 27 are laminated onto the power line 14, and the first insulation film 25, the second insulation film 26, and the third insulation film 27 have the film thickness Rd1. Accordingly, the area in which the opening C1 is not formed becomes the third area 28R. In addition, the opening C1 corresponds to the first area 28B and the second area 28G.

In addition, in step S7, the contact hole 28CT1, which exposes a part of the relay electrode 106G of the second area 28G, and the contact hole 28CT2, which exposes a part of the relay electrode 106R of the third area 28R, are formed at the same time.

Here, since the first insulation film 25 is formed of silicon nitride and the third insulation film 27 is formed of silicon oxide, a selection ratio is present when etching is performed between the first insulation film 25 and the third insulation film 27. In the area corresponding to the light emission area of the first area 28B, the first insulation film 25 is exposed, and thus an etching speed becomes slow, and, ideally, etching stops.

Since the contact hole 28CT2 is formed and the surface of the relay electrode 106R is exposed in the contact area of the third area 28R and the contact hole 28CT1 is formed and the surface of the relay electrode 106G is exposed in the contact area of the second area 28G, thus an etching speed becomes slow, and, ideally, etching stops. In the same manner, the surface of the relay electrode 106B is exposed and the first insulation film 25 is exposed in the periphery thereof in the contact area of the first area 28B, and thus an etching speed becomes slow, and, ideally, etching stops.

Figure 11D:
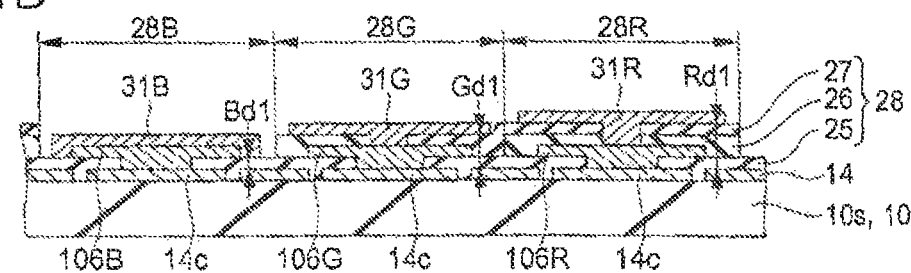

In step S8, ITO is formed to have a film thickness of approximately 100 nm using, for example, the sputtering method, and the pixel electrode 31 is formed by patterning the ITO as shown in FIG. 11D. In the first area 28B, the pixel electrode 31B which is directly connected to the relay electrode 106B is formed. In the second area 28G, the pixel electrode 31G, which is connected to the relay electrode 106G through the contact hole 28CT1, is formed. In the third area 28R, the pixel electrode 31R, which is connected to the relay electrode 106R through the contact hole 28CT2, is formed.

Thereafter, a step for forming the second insulation layer 29, which defines the light emission area of the light emitting pixel 20, a step for forming the light emission functional layer 32, and a step for forming the facing electrode 33 are provided.

According to the manufacturing method, it is possible to stably manufacture the organic EL apparatus 100 according to the embodiment.

Second Embodiment

Outline of Organic EL Apparatus

Figure 12:
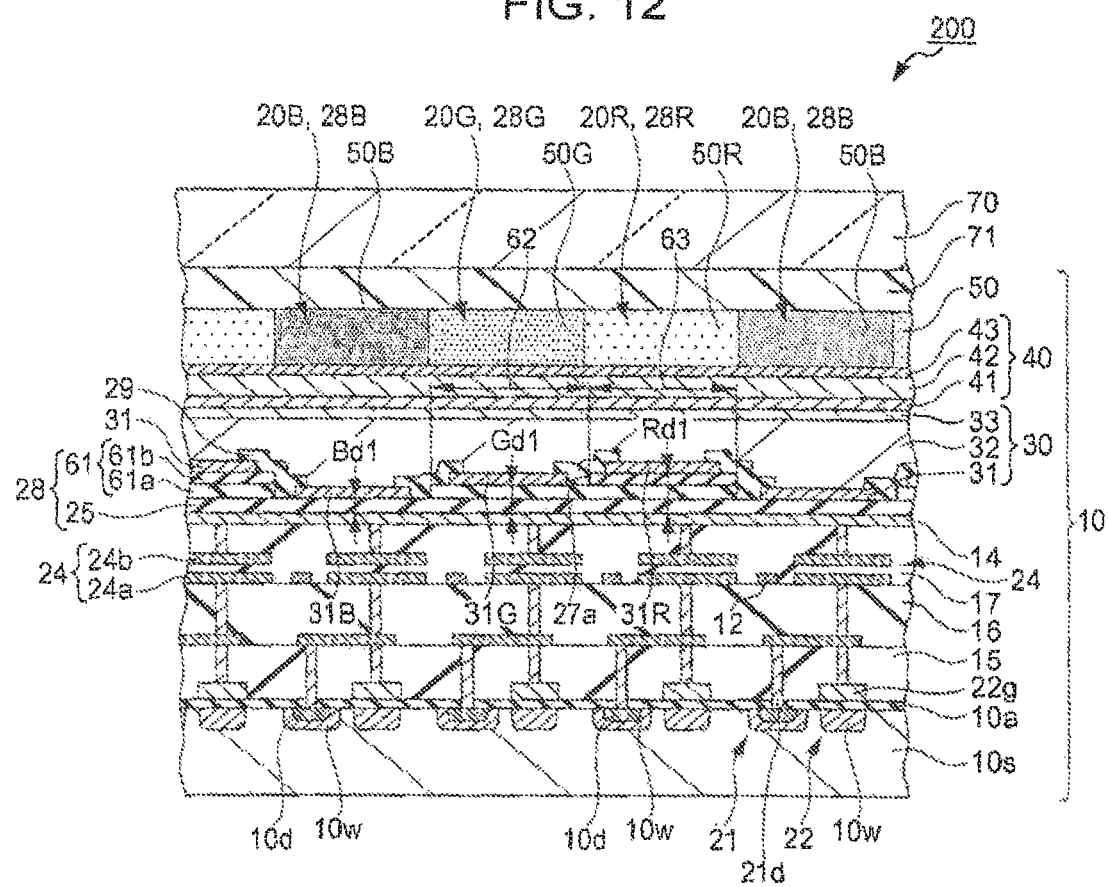
FIG. 12 is a schematic cross-sectional diagram illustrating the configuration of an organic EL apparatus according to a second embodiment.
Figure 13:
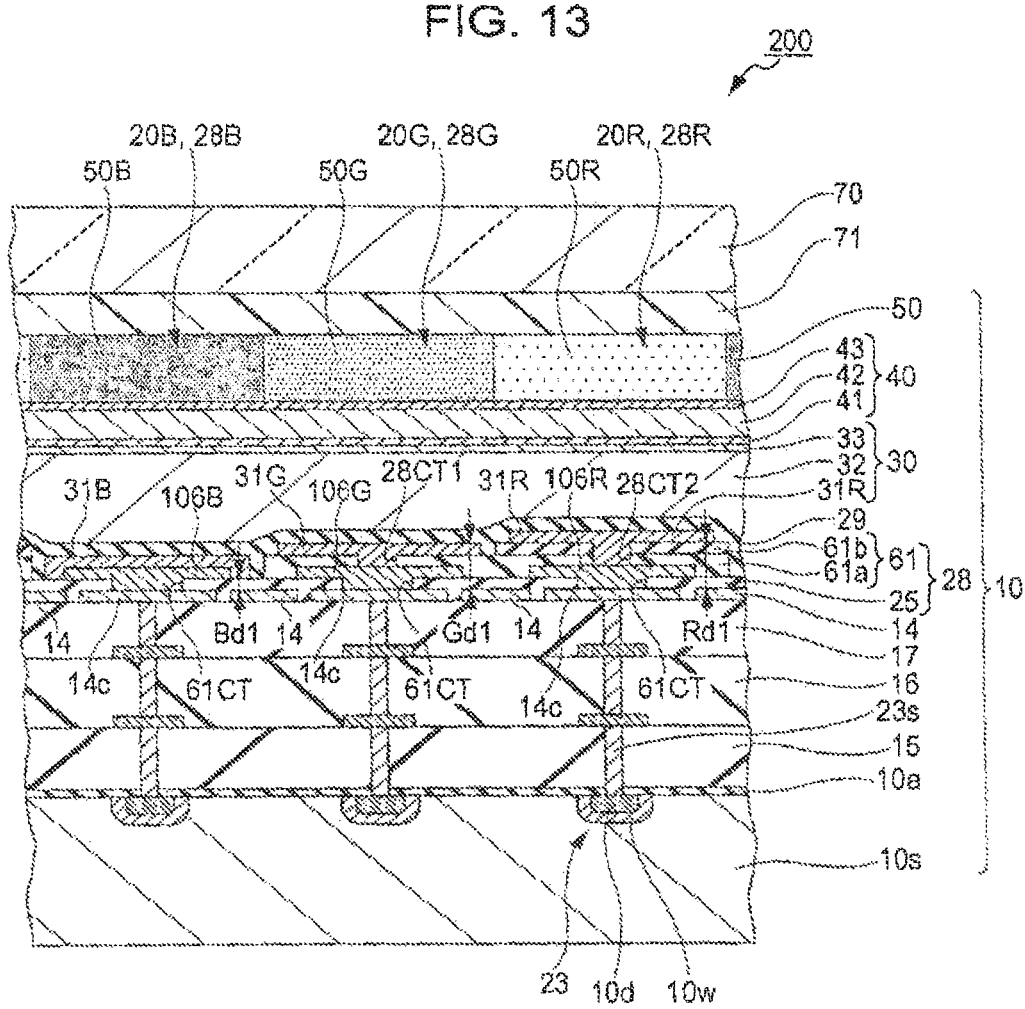
FIG. 13 is a schematic cross-sectional diagram illustrating the configuration of the organic EL apparatus according to the second embodiment.

FIG. 12 is a schematic cross-sectional diagram illustrating the configuration of an organic EL apparatus according to a second embodiment with regard to FIG. 4, that is, a schematic cross-sectional diagram illustrating an area, in which the openings are provided, in the second insulation layer which defines a light emission area. FIG. 13 is another schematic cross-sectional diagram illustrating the configuration of the organic EL apparatus according to the second embodiment with regard to FIG. 5, that is, a schematic cross-sectional diagram illustrating an area in which the pixel electrode is electrically connected to the third transistor.

Hereinafter, the outline of the organic EL apparatus 200 according to the embodiment will be described with reference to FIGS. 12 and 13 centering on the difference from the first embodiment. Meanwhile, the same reference numerals are attached to the same components as in the first embodiment, and the description thereof will not be repeated.

In the organic EL apparatus 200 according to the embodiment, the configuration of the first insulation layer 28 is different from that of the first embodiment and the other configurations are the same as in the first embodiment.

As shown in FIG. 12, a first insulation layer 28 is an optical distance adjustment layer which is arranged between a power line 14 as a light reflection layer and a pixel electrode 31. The first insulation layer 28 includes a first insulation film 25 and an organic insulation layer 61 which are sequentially laminated onto a side of the power line 14.

The first insulation film 25 has the same configuration as in the first embodiment, and is formed of silicon nitride which has a film thickness of approximately 50 nm.

The organic insulation layer 61 includes a first organic insulation film 61a and a second organic insulation film 61b, which are sequentially laminated from a side of the first insulation film 25. The first organic insulation film 61a and the second organic insulation film 61b are formed of an acrylic resin, and have approximately the same reflective index as the second insulation film 26 and the third insulation film 27 (silicon oxide) in the first embodiment. Therefore, the first organic insulation film 61a has the same film thickness as the second insulation film 26, that is, the same optical distance (the product of the reflective index and the film thickness) as in the first embodiment. The second organic insulation film 61b has the same film thickness as the third insulation film 27, that is, the same optical distance (the product of the reflective index and the film thickness) as in the first embodiment. More specifically, each of the film thicknesses of the first organic insulation film 61a and the second organic insulation film 61b is approximately 60 nm to 70 nm.

The first organic insulation film 61a and the second organic insulation film 61b may be a resin which has optical transparency. In addition to the above-described acrylic resin, it is possible to use polyester, a methacrylic resin, methacrylic acid-maleic acid copolymer, polystyrene, a transparent fluorine resin, polyimide, fluorinated polyimide, polyamide, polyamide imide, polyether imide, cellulose acylate, polyurethane, polyetheretherketone, polycarbonate, alicyclic polyolefine, polyarylate, polyethersulfone, polysulfone, fluorene ring-modified polycarbonate, alicyclic-modified polycarbonate, fluorene ring-modified polyester, acryloyl compound, polysiloxane, or another organic silicon compound.

When the reflective indexes of the first organic insulation film 61a and the second organic insulation film 61b are different from the reflective indexes of the second insulation film 26 and the third insulation film 27 according to the first embodiment, it is necessary to adjust the film thickness of the first organic insulation film 61a and the second organic insulation film 61b such that the optical distance is approximately the same as the optical distance between the second insulation film 26 and the third insulation film 27 according to the first embodiment.

The organic insulation layer 61 includes a part 62 in which the first organic insulation film 61a is arranged, and a part 63 in which the first organic insulation film 61a and the second organic insulation film 61b are arranged (laminated). The first insulation layer 28 of the light emitting pixel 20B, that is, the first insulation layer 28 of the first area 28B includes the first insulation film 25 and has a film thickness Bd1 (approximately 50 nm). The first insulation layer 28 of the light emitting pixel 20G, that is, the first insulation layer 28 of the second area 28G includes the first insulation film 25 and the first organic insulation film 61a (the organic insulation layer 61 of the part 62 in which the first organic insulation film 61a is arranged), and has a film thickness Gd1 (approximately 115 nm). The first insulation layer 28 of the light emitting pixel 20R, that is, the first insulation layer 28 of the third area 28R includes the first insulation film 25, the first organic insulation film 61a, and the second organic insulation film 61b (the organic insulation layer 61 of the part 63 in which the first organic insulation film 61a and the second organic insulation film 61b are arranged), and has a film thickness Rd1 (approximately 170 nm). In this manner, the part 62, in which the first organic insulation film 61a is arranged, corresponds to the second area 28G. The part 63, in which the first organic insulation film 61a and the second organic insulation film 61b are arranged, corresponds to the third area 28R.

The part 62, in which the first organic insulation film 61a is arranged, is an example of a "first flat section" in the invention, and, hereinafter, is referred to as a first flat section 62. The part 63, in which the first organic insulation film 61a and the second organic insulation film 61b are arranged, is an example of a "second flat section" in the invention, and, hereinafter, is referred to as a second flat section 63.

According to the configuration, it is possible to cause light, which is emitted from the light emission functional layer 32, to reciprocate between the power line 14 and the facing electrode 33, to resonate (amplify) light, which has the specific wavelength, and emits light, which has the specific wavelength, as display light from the sealing substrate 70. As a result, light of red color (R) which has a peak wavelength of 610 nm is emitted from the light emitting pixel 20R, light of green color (G) which has a peak wavelength of 540 nm is emitted from the light emitting pixel 20G, and light of blue color (B) which has a peak wavelength of 470 nm is emitted from the light emitting pixel 20B.

Outline of Contact Section

Subsequently, the outline of a part (contact section), in which the pixel electrode 31 is electrically connected to the third transistor 23, will be described with reference to FIG. 13.

As shown in FIG. 13, in the light emitting pixel 20B, the pixel electrode 31B is directly connected to the relay electrode 106B, and the configuration is the same as in the first embodiment.

In the light emitting pixel 20G, the first organic insulation film 61a (the organic insulation layer 61 of the first flat section 62) is provided between the relay electrode 106G and the pixel electrode 31G. In the first organic insulation film 61a, the contact hole 28CT1, which exposes a part of the relay electrode 106G, is provided. The pixel electrode 31G is connected to the relay electrode 106G through the contact hole 28CT1.

In the light emitting pixel 20R, the first organic insulation film 61a and the second organic insulation film 61b (the organic insulation layer 61 of the second flat section 63) are provided between the relay electrode 106R and the pixel electrode 31R. In the first organic insulation film 61a and the second organic insulation film 61b, the contact hole 28CT2, which exposes a part of the relay electrode 106R, is provided. The pixel electrode 31R is connected to the relay electrode 106R through the contact hole 28CT2.

In the embodiment, since the film thickness of the first insulation layer 28, which is an optical distance adjustment layer, is fixed in each of the light emitting pixels 20B, 20G, and 20R, it is possible to acquire the same advantage as in the first embodiment, in which it is possible to enlarge the light emission area (openings 29B, 29G, and 29R), compared to the well-known technique (JP-A-2009-134067).

Method of Manufacturing Organic EL Apparatus

Figure 14:
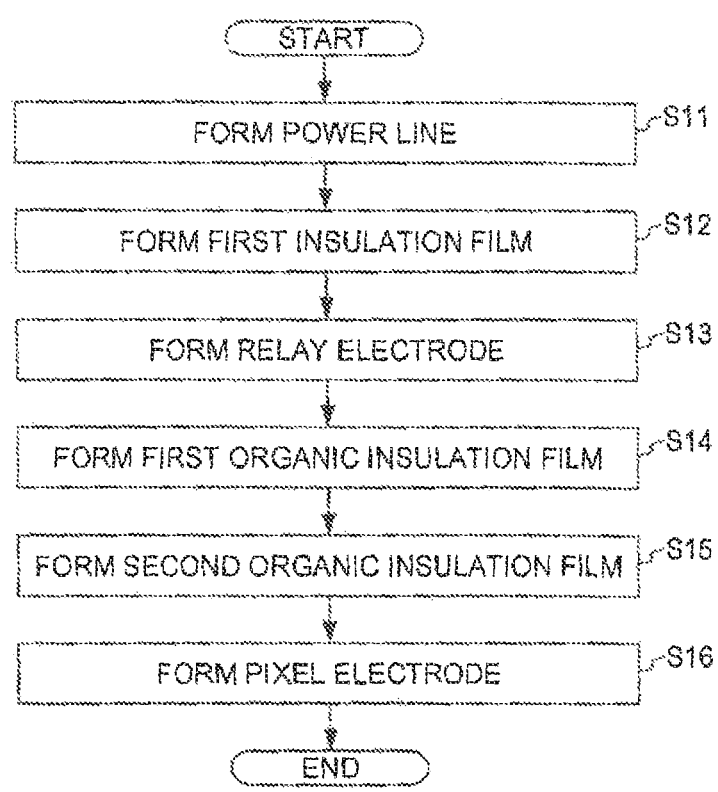
FIG. 14 is a process flowchart illustrating a method of manufacturing the organic EL apparatus.

Subsequently, a method of manufacturing the organic EL apparatus 200 will be described with reference to FIGS. 14 to 16C. FIG. 14 is a process flowchart illustrating the method of manufacturing the organic EL apparatus. FIGS. 15A to 16C are schematic cross-sectional diagrams illustrating the states of the organic EL apparatus after each process shown in FIG. 14 is performed with regard to FIGS. 10 and 11.

As shown in FIG. 14, a process to manufacture the organic EL apparatus 200 includes a process to form the power line 14 as the light reflection layer (step S11), a process to form the first insulation film 25 (step S12), a process to form the relay electrode 106 (step S13), a process to form the first organic insulation film 61a (step S14), a process to form the second organic insulation film 61b (step S15), and a process to form the pixel electrode 31 (step S16).

Meanwhile, step S11 is the same as step S1 according to the first embodiment, step S12 is the same as step S2 according to the first embodiment, step S13 is the same as step S3 according to the first embodiment, and step S16 is the same as step S9 according to the first embodiment.

Figure 15A:
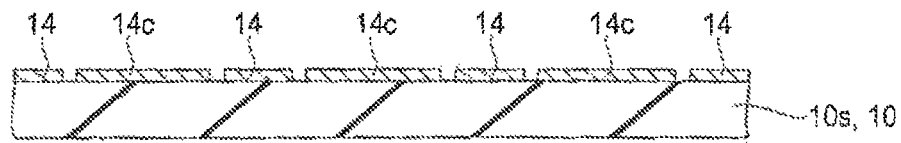
FIGS. 15A to 15C are schematic cross-sectional diagrams illustrating the states of the organic EL apparatus after each process is performed.

In step S11, the power line 14 and the relay electrode 14c are formed as shown in FIG. 15A.

Figure 15B:
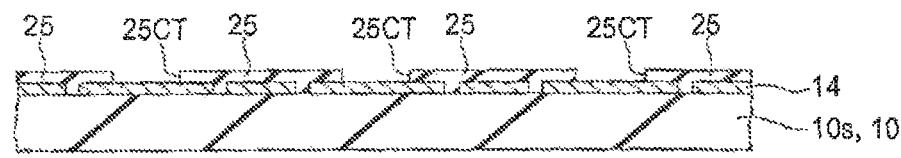

In step S12, the first insulation film 25, which includes the contact hole 25CT for exposing a part of the relay electrode 14c, is formed as shown in FIG. 15B.

Figure 15C:
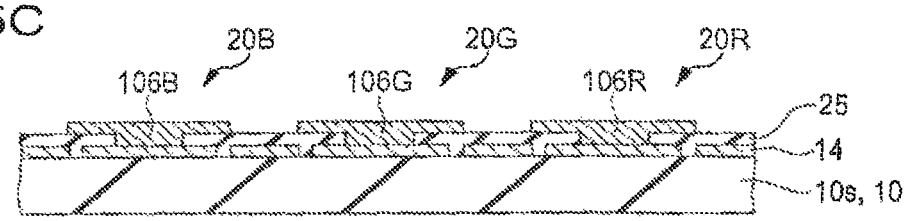

In step S13, the relay electrode 106 is formed to be superimposed on the relay electrode 14c in a plane view as shown in FIG. 15C.

Figure 16A:
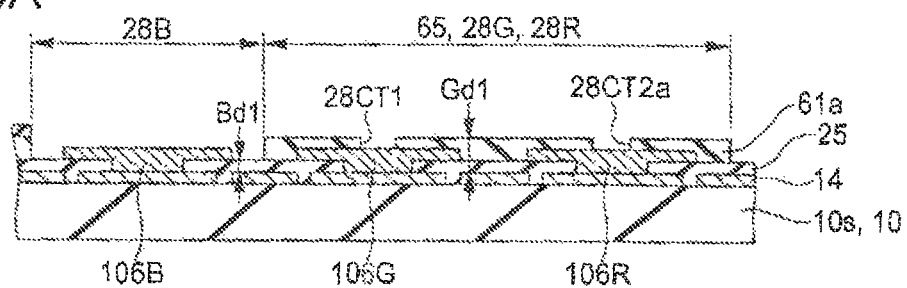
FIGS. 16A to 16C are schematic cross-sectional diagrams illustrating the states of the organic EL apparatus after each process is performed.

In step S14, the first organic insulation film 61a, which covers the first insulation film 25 and the relay electrode 106, is formed by, for example, coating a photosensitive acrylic resin and performing a thermal process (pre-bake), an exposure process, a development process, a hardening process, and the like, as shown in FIG. 16A. The photosensitive acrylic resin is a negative type resist, and an exposed part is hardened, and a non-exposed part is dissolved in a developer. The first organic insulation film 61a is formed in an area 65 ranging from the second area 28G to the third area 28R, and includes the contact hole 28CT1 for exposing a part of the relay electrode 106G and the contact hole 28CT2a for exposing a part of the relay electrode 106R.

Figure 16B:
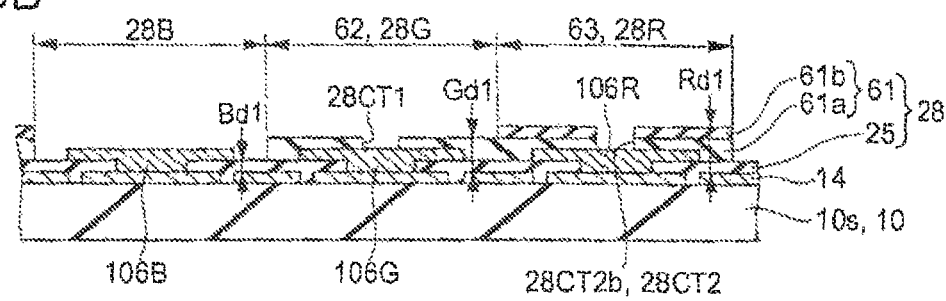

In step S15, the second organic insulation film 61b is formed by coating the same material (photosensitive acrylic resin) as in step S14 and performing the thermal process (pre-bake), the exposure process, the development process, the hardening process, and the like, as shown in FIG. 16B. The second organic insulation film 61b is formed on the first organic insulation film 61a of the third area 28R. That is, the second flat section 63 is formed by laminating the second organic insulation film 61b on the first organic insulation film 61a. The first organic insulation film 61a in a part, in which the second organic insulation film 61b is not laminated, is the first flat section 62.

In addition, the second organic insulation film 61b includes a contact hole 28CT2b for exposing a part of the relay electrode 106R. The contact hole 28CT2 for exposing a part of the relay electrode 106R is formed using the contact hole 28CT2a, which is provided in the first organic insulation film 61a, and the contact hole 28CT2b which is provided in the second organic insulation film 61b.

Figure 16C:
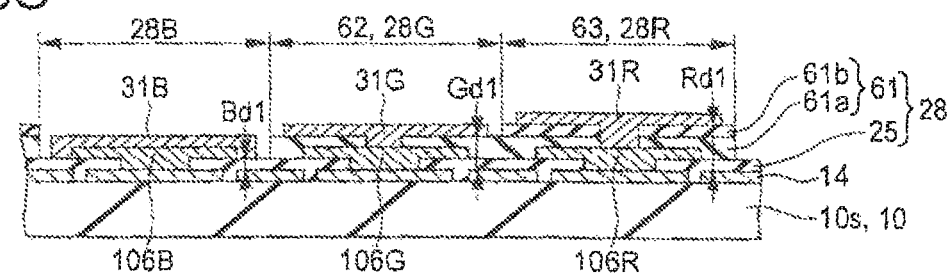

In step S16, the pixel electrode 31B, which is directly connected to the relay electrode 106B, is formed in the first area 28B, the pixel electrode 31G, which is connected to the relay electrode 106G through the contact hole 28CT1, is formed in the second area 28G, and the pixel electrode 31R, which is connected to the relay electrode 106R through the contact hole 28CT2, is formed in the third area 28R, as shown in FIG. 16C.

In the embodiment, since the first organic insulation film 61a, which corresponds to the second insulation film 26 according to the first embodiment, and the second organic insulation film 61b, which corresponds to the third insulation film 27 according to the first embodiment, are formed by a photolithographic process with negative resistance (photosensitive acrylic resin), and the process to form and etch a film, which is necessary to form the second insulation film 26 and the third insulation film 27 of the first embodiment, is omitted. Accordingly, compared to the first embodiment, the process to manufacture the first insulation layer 28 is simplified, and thus it is possible to improve the productivity of the organic EL apparatus 200 and to reduce the manufacturing cost of the organic EL apparatus 200.

Third Embodiment

Electronic Equipment

Figure 17:
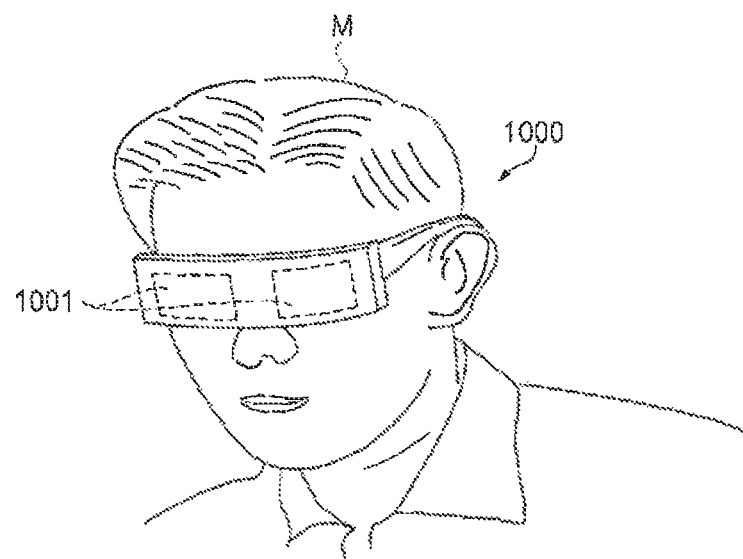
FIG. 17 is a schematic diagram illustrating a head mounted display.

FIG. 17 is a schematic diagram illustrating a head mounted display as an example of electronic equipment.

As shown in FIG. 17, a head mounted display 1000 includes two display units 1001 which are provided to correspond to the right and left eyes. When an observer M mounts the head mounted display 1000 on the head like glasses, the observer M can see letters, images, and the like which are displayed on the display units 1001. For example, if images are displayed in consideration of the parallax between the right and left display units 1001, it is possible to see and enjoy stereoscopic images.

In the display units 1001, the organic EL apparatus 100 according to the first embodiment or the organic EL apparatus 200 according to the second embodiment is mounted. Since the organic EL apparatus 100 and the organic EL apparatus 200 include the optical resonance structure, the color purity of light which is emitted from the light emitting pixels 20B, 20G, and 20R is enhanced. Further, since the light emission area (openings 29B, 29G, and 29R) is wide in the organic EL apparatus 100 and the organic EL apparatus 200, a bright and clear display is provided. Accordingly, it is possible to provide the head mounted display 1000 with a bright and clear display.

Meanwhile, the electronic equipment in which the organic EL apparatus 100 or the organic EL apparatus 200 is mounted is not limited to the head mounted display 1000. For example, the organic EL apparatus 100 or the organic EL apparatus 200 may be mounted on electronic equipment which includes a display unit such as a head up display, an electronic viewfinder of a digital camera, a personal digital assistant, and a navigator. Further, the invention is not limited to the display units and the invention can be applied to a lighting system or exposure equipment.

The invention is not limited to the embodiments, and appropriate modifications are possible without departing from the gist or the spirit of the invention which is read from the claims or the whole specification. A light emitting device accompanying such a modification and electronic equipment on which the light emitting device is mounted are included in the technical range of the invention.

Various modification examples may be conceivable in addition to the embodiments. Hereinafter, modification examples will be described.

First Modification Example

Figure 18:
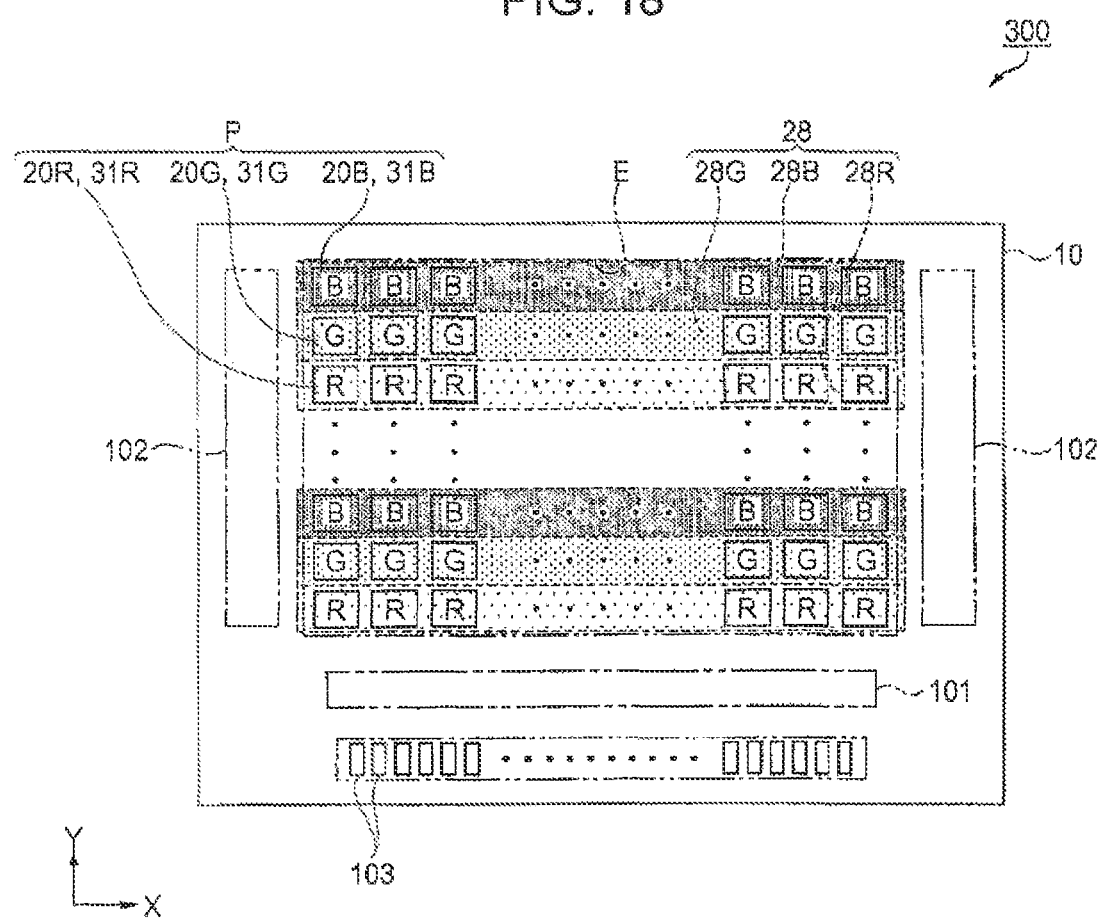
FIG. 18 is a schematic plane view illustrating the configuration of an organic EL apparatus according to a first modification example.

FIG. 18 is a schematic plane view illustrating the configuration of an organic EL apparatus according to a first modification example. As shown in the drawing, in the organic EL apparatus 300 according to the modification example, a first area 28B, a second area 28G, and a third area 28R have a rectangular shape which is extended in the X direction. In this manner, the first area 28B, the second area 28G, and the third area 28R are not limited to the rectangular shape which is extended in the Y direction (the first embodiment), and may have, for example, the rectangular shape which is extended in the X direction.

Meanwhile, in the organic EL apparatus according to the first modification example, the Y direction is an example of a "first direction" in the invention, and the X direction is an example of a "second direction" in the invention. In the X direction, the light emitting pixels 20, in which the same color light emission is acquired, are arranged. That is, the light emitting pixels 20B, in which the blue color (B) light emission is acquired, are arranged in the X direction, and form a rectangular shape (stripe shape). The light emitting pixels 20G, in which the green color (G) light emission is acquired, are arranged in the X direction, and form a rectangular shape (stripe shape). The light emitting pixels 20R, in which the red color (R) light emission is acquired, are arranged in the X direction, and form a rectangular shape (stripe shape). In the Y direction, the light emitting pixels 20, in which different color light emission is acquired, are repeatedly arranged in the order of B, G and R. Meanwhile, the arrangement of the light emitting pixels 20 in the Y direction may not be in the order of B, G, and R, and may be, for example, in the order of R, G, and B.

Second Modification Example

Figure 19:
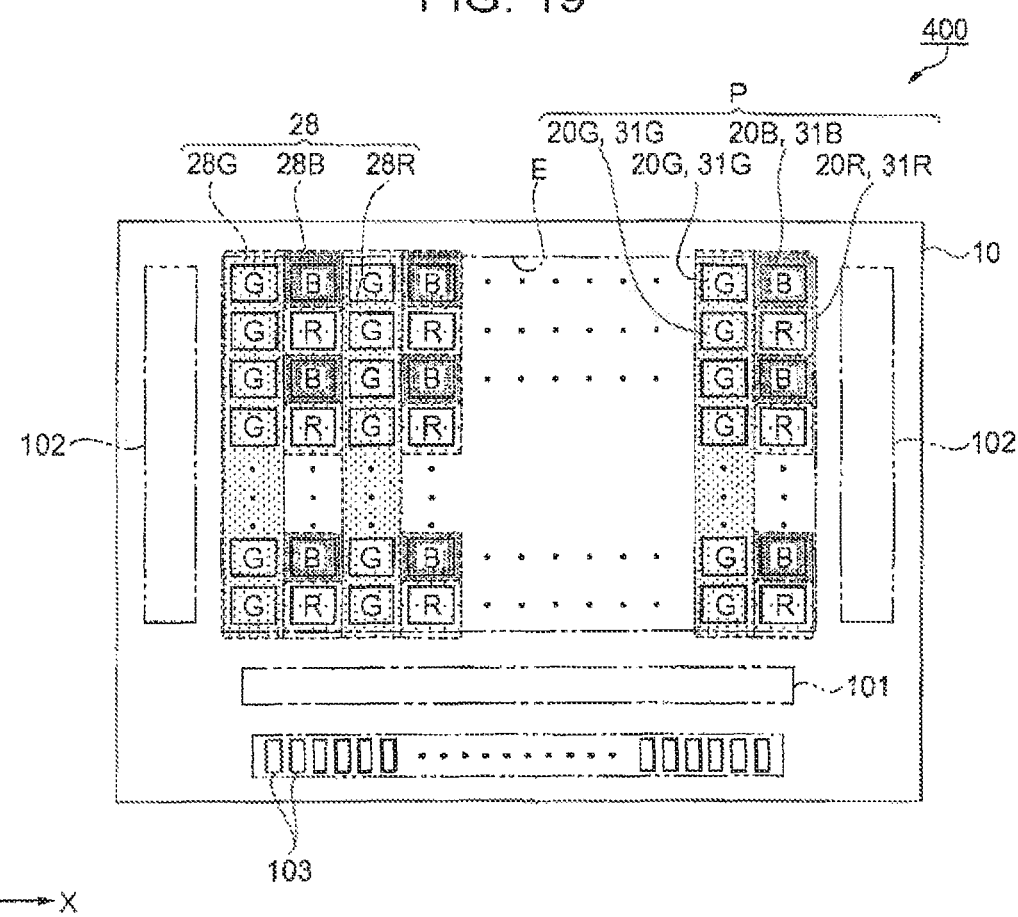
FIG. 19 is a schematic plane view illustrating the configuration of an organic EL apparatus according to a second modification example.

FIG. 19 is a schematic plane view illustrating the configuration of an organic EL apparatus according to a second modification example. As shown in the drawing, in the organic EL apparatus 400 according to the modification example, the light emitting pixels 20G are arranged along the Y direction, the light emitting pixel 20B and the light emitting pixel 20R are alternately arranged along the Y direction, and thus a display unit P includes two light emitting pixels 20G, a single light emitting pixel 20B, and a light emitting pixel 20R. In this manner, the display unit P includes four light emitting pixels 20, and thus it is possible to perform more intense display, compared to the case where the display unit P includes three light emitting pixels 20.

The second area 28G in which the light emitting pixels 20G are arranged has a rectangular shape which is extended in the Y direction. The first area 28B has approximately the same shape as the light emitting pixel 20B, and the third area 28R has the same shape as the light emitting pixel 20R. The first area 28B and the third area 28R are alternately arranged along the Y direction.

As described above, an area, in which the light emitting pixel 20B is arranged, is the first area 28B, an area, in which the light emitting pixel 20G is arranged, is the second area 28G, and an area, in which the light emitting pixel 20R is arranged, is the third area 28R. Therefore, the arrangement of the first area 28B, the second area 28G, and the third area 28R varies in correspondence to the arrangement of the light emitting pixels 20B, 20G, and 20R.

For example, if the light emitting pixels 20B, 20G, and 20R are arranged in a stripe shape, the first area 28B, the second area 28G, and the third area 28R are arranged as shown in the first embodiment or the second embodiment (refer to FIGS. 1 and 18). For example, if the light emitting pixels 20B, 20G, and 20R are arranged in a zigzag, the first area 28B, the second area 28G, and the third area 28R are also arranged in a zigzag.

Third Modification Example

The organic insulation layer 61 is not limited to include two organic insulation films (the first organic insulation film 61a and the second organic insulation film 61b), and may include a single organic insulation film. For example, the organic insulation layer 61 may be formed using a method of performing multi-gradation exposure, which has a different exposure value for each area, on a positive-type photosensitive resin using a multi-gradation exposure mask, and integrally forming areas (the first flat section 62, the second flat section 63, and the contact holes 28CT1 and 28CT2) of different film thickness. It is possible to use, for example, alkali-soluble resin (novolac resin or the like), in which a sensitive material (naphthoquinone diazide substitution compound or the like) is dispersed, or the like as the positive-type photosensitive resin. Since the organic insulation layer 61 is formed using a single organic insulation film, it is possible to enhance the productivity. In addition, the organic insulation layer 61 may include three or more organic insulation films.

Fourth Modification Example

The second organic insulation film 61a and the second organic insulation film 61b are not limited to be formed by the photolithographic process with the negative resist (photosensitive resin). For example, the second organic insulation film 61a and the second organic insulation film 61b may be formed using a printing method, an inkjet method, or the like. In the same manner, the organic insulation layer 61 according to the third modification example may be formed using the printing method, the inkjet method, or the like.

Fifth Modification Example

The first insulation film 25 may be formed of organic material, that is, all of the first insulation layer 28 may be formed of an organic material. For example, the first insulation film 25 may be formed using the photolithographic process in which the same organic material (photosensitive acrylic resin) as in the second embodiment is used. When the material which forms the first insulation film 25 is changed from the inorganic material (silicon nitride) into the organic material (photosensitive acrylic resin) and patterning is performed using only the photolithographic process, it is possible to enhance the productivity.

The entire disclosure of Japanese Patent Application No. 2013-175339, filed Aug. 27, 2013 is expressly incorporated by reference herein.

What is claimed is:
1. A light emitting device comprising:
a transistor having a gate layer;
a capacitor;
an electrode;
a first pixel electrode disposed in a layer between the transistor and the electrode;
a light emission functional layer disposed in a layer between the electrode and the first pixel electrode;
a first conductive layer disposed in a layer between the first pixel electrode and the transistor, and configured to be supplied with a constant potential;

a second conductive layer disposed in a layer between the first conductive layer and the transistor, the second conductive layer electrically connected to the transistor;

a third conductive layer disposed in a layer between the second conductive layer and the transistor, the third conductive layer electrically connected to the capacitor;

a first insulating layer disposed in a layer between the first conductive layer and the second conductive layer, the first insulating layer including a first contact hole via which the first conducive layer is electrically connected to the second conducive layer; and a second insulating layer disposed in a layer between the third conductive layer and the transistor, the second insulating layer including a second contact hole via which the third conducive layer is electrically connected to the gate layer, wherein in a plan view, a region where the first pixel electrode contacts with the light emission functional layer overlaps with the first conductive layer, the second conductive layer, and the third conductive layer respectively, and in a cross-sectional view, a width of the first contact hole is wider than a width of the second contact hole.

2. The light emitting device according to claim 1, wherein
in the plan view, the first conductive layer overlaps with the first pixel electrode.

3. The light emitting device according to claim 1, wherein
in the plan view, the first conductive layer overlaps with the transistor.

4. The light emitting device according to claim 1, wherein
in the plan view, the first contact hole overlaps with the first pixel electrode.

5. The light emitting device according to claim 4, wherein
the light emission functional layer includes a light emission area, and
in the plan view, the first contact hole overlaps with the light emission area.

6. The light emitting device according to claim 1, wherein
in the plan view, the first contact hole overlaps with the transistor.

7. The light emitting device according to claim 1, wherein
in the plan view, the second contact hole overlaps with the first pixel electrode.

8. The light emitting device according to claim 7, wherein
the light emission functional layer includes a light emission area, and
in the plan view, the second contact hole overlaps with the light emission area.

9. The light emitting device according to claim 1, wherein
in the plan view, the second contact hole overlaps with the transistor.

10. The light emitting device according to claim 1, further comprising
the second insulating layer includes a third contact hole via which the second conductive layer is electrically connected to the transistor, wherein
in the plan view, the third contact hole overlaps with the first pixel electrode.

11. The light emitting device according to claim 10, wherein
the light emission functional layer includes a light emission area, and
in the plan view, the third contact hole overlaps with the light emission area.

12. The light emitting device according to claim 1, wherein comprising
the second insulating layer includes a third contact hole via which the second conductive layer is electrically connected to the transistor, and
in the plan view, at least one of the first contact hole, the second contact hole and the third contact hole overlaps with the first pixel electrode.

13. The light emitting device according to claim 12, wherein
the light emission functional layer includes a light emission area, and
in the plan view, at least one of the first contact hole, the second contact hole and the third contact hole overlaps with the light emission area.

14. The light emitting device according to claim 1, wherein
in the plan view, the first conductive layer partially overlaps with the first pixel electrode, and the third conductive layer completely overlaps with the first pixel electrode.

15. An electronic device comprising the light emitting device according to claim 1.

16. The light emitting device according to claim 1, wherein
in the plan view, the region where the first pixel electrode contacts with the light emission functional layer overlaps with the first contact hole and the second contact hole respectively.

17. A light emitting device comprising:
a substrate;
a transistor having a gate layer;
a capacitor;
an electrode;
a first pixel electrode disposed in a layer between the transistor and the electrode;
a light emission functional layer disposed in a layer between the electrode and the first pixel electrode;
a first conductive layer disposed in a layer between the first pixel electrode and the substrate, and configured to be supplied with a constant potential;
a second conductive layer disposed in a layer between the first conductive layer and the substrate, the second conductive layer electrically connected to the transistor;
a third conductive layer disposed in a layer between the second conductive layer and the substrate, the third conductive layer electrically connected to the capacitor;
a first insulating layer disposed in a layer between the first conductive layer and the second conductive layer, the first insulating layer including a first contact hole via which the first conducive layer is electrically connected to the second conducive layer; and
a second insulating layer disposed in a layer between the third conductive layer and the transistor, the second insulating layer including a second contact hole via which the third conducive layer is electrically connected to the gate layer, wherein
in a plan view, a region where the first pixel electrode contacts with the light emission functional layer overlaps with the first conductive layer, the second conductive layer, and the third conductive layer respectively, and
in a cross-sectional view, a width of the first contact hole is wider than a width of the second contact hole.

18. The light emitting device according to claim 17, wherein
in the plan view, the region where the first pixel electrode contacts with the light emission functional layer overlaps with the first contact hole and the second contact hole respectively.

19. An electronic device comprising the light emitting device according to claim 17.

* * * * *